US011357102B2

(12) United States Patent
Vasquez Quintero

(10) Patent No.: US 11,357,102 B2
(45) Date of Patent: Jun. 7, 2022

(54) METHOD FOR FORMING NON-FLAT DEVICES

(71) Applicants: IMEC VZW, Leuven (BE); Universiteit Gent, Ghent (BE)

(72) Inventor: Andres Felipe Vasquez Quintero, Antwerp (BE)

(73) Assignees: IMEC VZW, Leuven (BE); Universiteit Gent, Ghent (BE)

(*) Notice: Subject to any disclaimer, the term of this patent is extended or adjusted under 35 U.S.C. 154(b) by 561 days.

(21) Appl. No.: 16/465,076

(22) PCT Filed: Oct. 18, 2017

(86) PCT No.: PCT/EP2017/076574
§ 371 (c)(1),
(2) Date: May 29, 2019

(87) PCT Pub. No.: WO2018/099648
PCT Pub. Date: Jun. 7, 2018

(65) Prior Publication Data
US 2019/0387619 A1    Dec. 19, 2019

(30) Foreign Application Priority Data
Nov. 29, 2016  (EP) .................................... 16201254

(51) Int. Cl.
*H05K 1/02* (2006.01)
*B29D 11/00* (2006.01)
(Continued)

(52) U.S. Cl.
CPC ..... *H05K 1/0281* (2013.01); *B29D 11/00038* (2013.01); *B29D 11/00807* (2013.01);
(Continued)

(58) Field of Classification Search
CPC .. H05K 1/0281; H05K 3/0014; H05K 3/0026; H05K 2201/2009; B29D 11/00038; B29D 11/00807; B29K 2701/12
See application file for complete search history.

(56) References Cited
U.S. PATENT DOCUMENTS 8,386,977 B2 * 2/2013 Farooq ................. G06F 30/398
716/51
9,247,648 B2    1/2016 Vanfleteren et al.
(Continued)

FOREIGN PATENT DOCUMENTS

EP    3001780 A1    3/2016
EP    3070516 A1    9/2016
(Continued)

OTHER PUBLICATIONS

PCT International Search Report and Written Opinion, PCT International Application No. PCT/EP2017/076574, dated Jan. 1, 2018, 14 pages.
(Continued)

Primary Examiner — Jeffrey T Carley
(74) Attorney, Agent, or Firm — McDonnell Boehnen Hulbert & Berghoff LLP

(57) ABSTRACT

In a first aspect, the present disclosure relates to a method for designing a pattern of a stress relief layer for a flat device to be transformed into a shape-retaining non-flat device by deformation of the flat device. The flat device (and thus also the non-flat device) may comprise at least two components and at least one electrical interconnection between two components. In a second aspect, the present disclosure is related to a method of manufacturing a shape-retaining non-flat device by deformation of a flat device, wherein the flat device is attached to a patterned stress relief layer designed in accordance with the first aspect of the present disclosure. In preferred embodiments, the stress relief layer (Continued)

is a thermoplastic layer or a layer comprising a thermoplastic material and deformation of the flat device comprises deformation by a thermoforming process, after attachment of the flat device to the stress relief layer.

13 Claims, 14 Drawing Sheets

(51) Int. Cl.
  *H05K 3/00* (2006.01)
  *B29K 701/12* (2006.01)
(52) U.S. Cl.
  CPC ......... *H05K 3/0014* (2013.01); *H05K 3/0026* (2013.01); *B29K 2701/12* (2013.01); *H05K 2201/2009* (2013.01)

(56) References Cited

U.S. PATENT DOCUMENTS

| | | | | |
|---|---|---|---|---|
| 2002/0073388 A1* | 6/2002 | Orshansky | ............ | G06F 30/367 |
| | | | | 716/120 |
| 2009/0006039 A1* | 1/2009 | Watanabe | ............... | G06F 30/00 |
| | | | | 703/1 |
| 2009/0064058 A1* | 3/2009 | McIlrath | ............... | G06F 30/398 |
| | | | | 716/118 |
| 2009/0317639 A1* | 12/2009 | Axisa | .................... | H05K 1/0283 |
| | | | | 428/411.1 |
| 2014/0084489 A1 | 3/2014 | Etzkorn | | |
| 2014/0240932 A1* | 8/2014 | Hsu | .......................... | H05K 1/09 |
| | | | | 361/749 |
| 2014/0333892 A1 | 11/2014 | Pugh et al. | | |
| 2015/0146159 A1* | 5/2015 | Archer | ............ | B29D 11/00153 |
| | | | | 351/159.03 |
| 2016/0165719 A1* | 6/2016 | Li | ........................ | A61B 5/6823 |
| | | | | 361/749 |

FOREIGN PATENT DOCUMENTS

| | | | | |
|---|---|---|---|---|
| WO | 2016/022665 A1 | 2/2016 | | |
| WO | WO-2016022665 A1 * | 2/2016 | ............. | G02C 7/049 |

OTHER PUBLICATIONS

Quintero, Andres Vasquez et al., "Stretchable Electronic Platform for Soft and Smart Contact Lens Applications", MRS Spring Meeting, Phoenix, USA, Mar. 31, 2016, 15 pages.

Quintero, Andres Vasquez et al., "Stretchable Electronic Platform for Soft and Smart Contact Lens Applications-Abstract", Symposium SM3: Soft Materials for Compliant and Bioinspired Electronics, Mar. 31, 2016, 1 page.

De Smet, J. et al., "Design and Wrinkling Behavior of a Contact Lens With an Integrated Liquid Crystal Light Modulator", Journal of Display Technology, vol. 8, No. 5, May 2012, pp. 299-305.

* cited by examiner

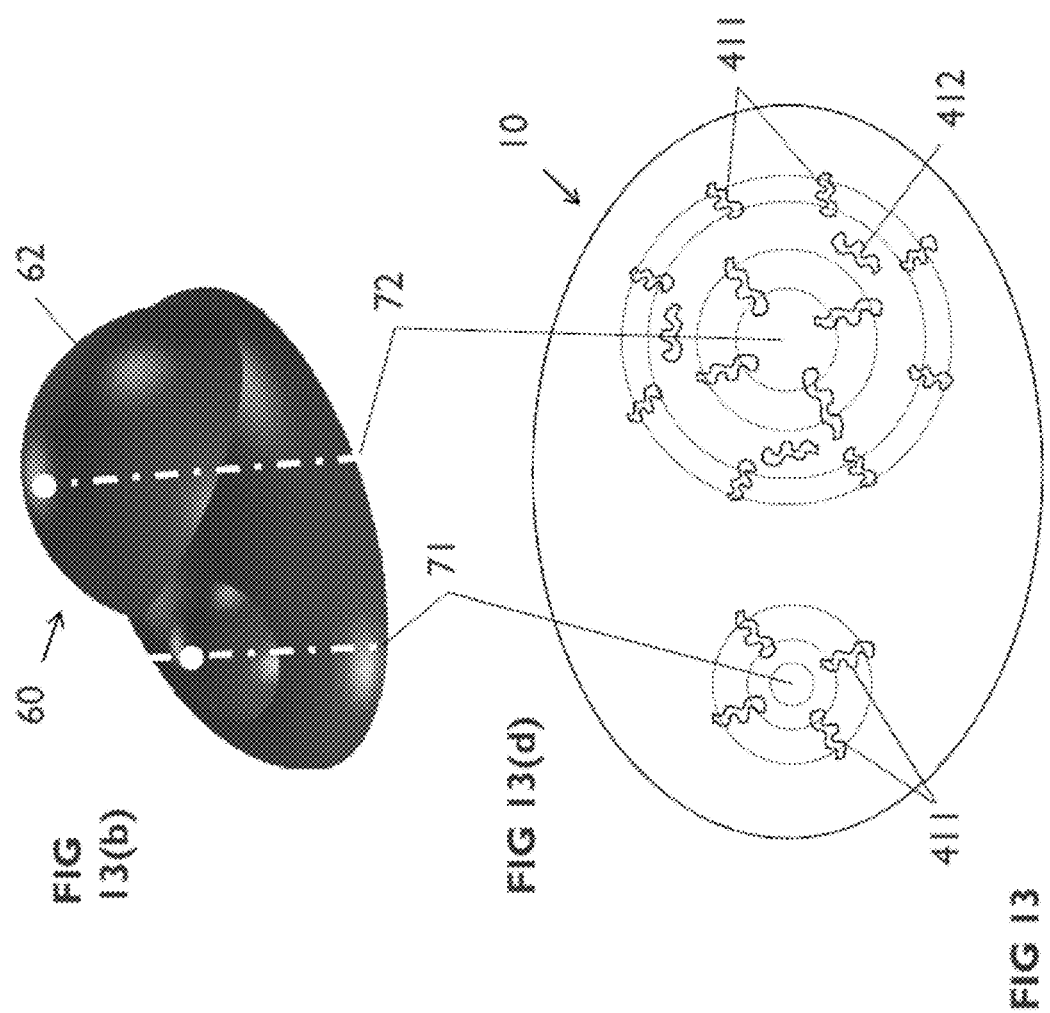
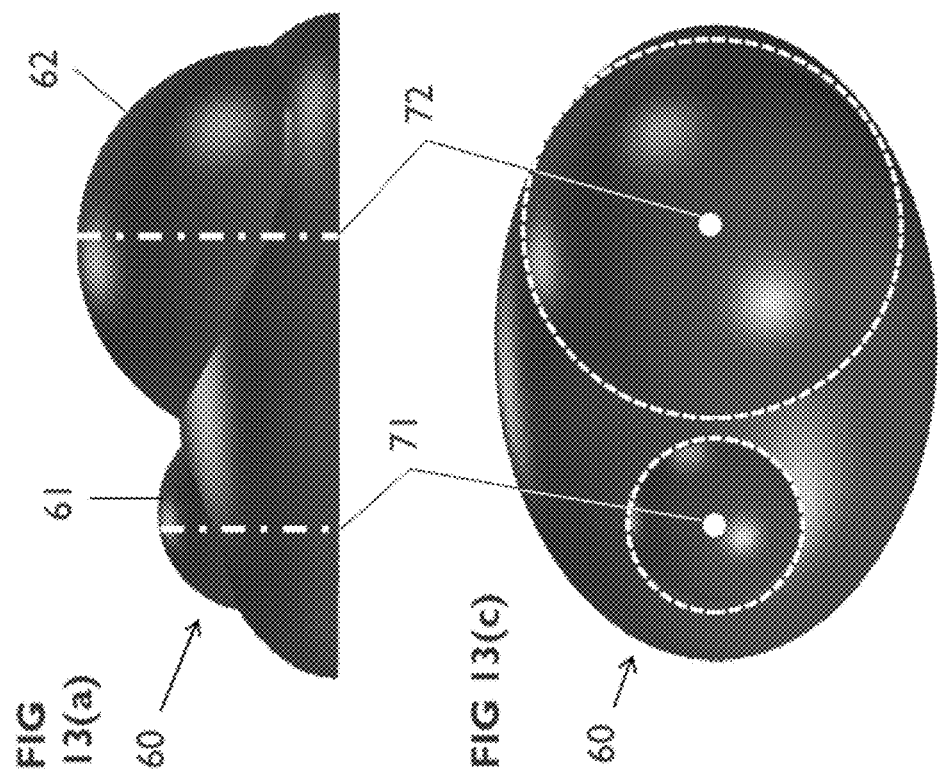
FIG 13

METHOD FOR FORMING NON-FLAT DEVICES

CROSS-REFERENCE TO RELATED APPLICATIONS

The present application is a national stage entry of PCT/EP2017/076574 filed Oct. 18, 2017, which claims priority to European Patent Application No. 16201254.6 filed Nov. 29, 2016, the contents of which are hereby incorporated by reference.

FIELD

The present disclosure relates to methods for forming non-flat devices comprising at least one circuit, such as an electronic circuit comprising components and electrical interconnections, wherein the non-flat devices are fabricated by thermoforming of an initially flat device.

The present disclosure results from work supported by the European Commission, Marie Skłodowska-Curie actions, Individual Fellowship (IF), Grant No. 661092, project name: STRETCHLENS.

BACKGROUND

Methods and technologies are known for fabricating 2.5D (i.e. non-flat), e.g. rigid, arbitrarily shaped structures and devices. Electronic circuits or sensor structures may be integrated in such non-flat structures. A cost-efficient method that may be used for fabricating such structures or devices comprises first fabricating a flexible circuit, e.g. an electronic circuit, on a 2D (flat) carrier based on a flexible circuit board technology and next transferring the flat circuit to a thermoplastic carrier or thermoplastic layer or embedding the flat circuit in a thermoplastic material. Afterwards a thermoforming step may be performed, comprising heating the structure to a temperature above the glass transition temperature of the thermoplastic material, pushing it against a mold having the desired 2.5D shape e.g. using vacuum, cooling down and removing the structure from the thermoforming tool. Such approach may for example be used for fabricating smart contact lenses, wherein a flat disk-shaped structure is transformed into a non-flat structure having a spherical cap shape.

During the thermoforming step the flat structure or device undergoes a deformation into a non-flat structure or device. This results in stress profiles being developed during and after the deformation process, which may hamper the integrity of the circuit and of the entire structure. The thermoplastic material in which the device is embedded may for example be a polyethylene terephthalate (PET) or a thermoplastic polyurethane (TPU). Additionally, other types of polymers may be present in the structure (for example as part of the flexible circuit), such as for example polyimide (PI) which is a thermosetting material.

Regarding the boundary conditions, two different approaches may be used in the thermoforming process. In a first approach the structure to be thermoformed is fully clamped at the edges. In a second approach the structure to be thermoformed is in a free standing condition, i.e. not clamped at its edges. When fabricating contact lenses, e.g. smart contact lenses, using such a thermoforming approach, the stress induced during thermoforming is mostly tensile stress in case of a fully clamped condition, and mostly compressive stress, both in the circumferential and meridional directions, in case of a free-standing condition. The compressive stress along the circumferential direction is inversely proportional to the radius of curvature of the 2.5D shape (and thus the radius of curvature of the mold) and depends on the distance from the center of the lens. This compressive stress may cause buckling of the thermosetting and/or thermoplastic material, mainly near the outer edges.

For the specific application of smart contact lenses, it is common to provide an antenna, e.g. an RF antenna, near the edges of the contact lens to enable wireless communication with the outside environment. However, the position of the antenna, as well as the nature of the material supporting the antenna (e.g. a thermosetting material such as PI) leads to the generation of wrinkles or to folding in and damage to the material supporting the antenna and thus also to the antenna itself, as a result of the thermoforming process.

SUMMARY

It is an object of embodiments of the present disclosure to provide methods for manufacturing shape-retaining non-flat devices by deformation of a flat device by means of a thermoforming process, wherein the flat device comprises a circuit, and wherein the amount of stress acting on the circuit during the thermoforming process is substantially reduced at least locally as compared to known methods. In embodiments of the present disclosure the circuit may comprise at least two components and at least one electrical interconnection between two components.

The above objective is accomplished by methods according to the present disclosure.

In a first aspect, the present disclosure is related to a method for designing a pattern of a stress relief layer for a flat device to be transformed into a shape-retaining non-flat device by deformation of the flat device. The flat device (and thus also the non-flat device) may comprise at least two components and at least one electrical interconnection between two components. The stress relief layer comprises a layer of thermo-formable material and is designed for mechanical attachment to the flat device before deformation. In some embodiments, the flat device is a thermo-formable flat device and deformation of the flat device comprises deformation by a thermoforming process.

A method for designing a pattern of a stress relief layer for a flat device to be transformed into a shape-retaining non-flat device by deformation of the flat device, the flat device comprising at least two components and at least one electrical interconnection between two components, according to the first aspect of the present disclosure comprises: providing a layout of the flat device, the layout comprising the at least two components and the at least one electrical interconnection, the layout further comprising a patterned supporting layer having a first pattern comprising at least one component island and at least one component interconnection track, the at least one component island having a component island pattern covering at least on area corresponding to the location of at least one component and the at least one component interconnection track having a component interconnection pattern covering at least an area corresponding to the location of an electrical interconnection; and defining a second pattern at least partially, e.g. substantially, covering the first pattern. In embodiments according to the first aspect of the present disclosure, defining the second pattern comprises: inserting a stress relief island for each component island, the stress relief island having a stress relief island pattern at least partially covering the corresponding component island pattern, thereby obtaining a second pattern, the second pattern being the pattern of the stress relief layer.

In embodiments of a method according to the first aspect of the present disclosure, defining the second pattern may further comprise inserting a stress relief interconnection track for at least one component interconnection track, the stress relief interconnection track having a stress relief interconnection pattern fully covering the corresponding at least one component interconnection pattern.

In embodiments of a method according to the first aspect of the present disclosure, defining the second pattern may further comprise inserting a stress relief island for at least two component interconnection track, the stress relief island having a stress relief island pattern fully covering the corresponding at least two component interconnection patterns. The stress relief island for the at least two component interconnection tracks may fully cover a plurality of component interconnection patterns, e.g. more than two component interconnection patterns.

In embodiments of a method according to the first aspect of the present disclosure, a stress relief island may have a stress relief island pattern at least partially covering a component island pattern and further covering at least one component interconnection pattern.

In some embodiments of a method according to the first aspect of the present disclosure the stress relief layer may be a thermoplastic layer such as for example a layer comprising a thermoplastic polyurethane (TPU), polyethylene terephthalate (PET), polyethylene naphthalate (PEN), poly lactic acid (PLA), parylene-C, polycarbonate (PC), poly copolymers (PLGA), or permanent, the present disclosure not being limited thereto. It may comprise a single thermoplastic layer or it may comprise a stack of at least two thermoplastic layers, i.e. two or more than two thermoplastic layers, the present disclosure not being limited thereto.

In embodiments of a method according to the first aspect of the present disclosure the stress relief islands may have a stress relief island pattern that partially covers the corresponding component island pattern.

In embodiments of a method according to the first aspect of the present disclosure the stress relief islands may have a stress relief island pattern that substantially covers the corresponding component island pattern, i.e. a stress relief island pattern covering a substantial part of the corresponding component island pattern.

In embodiments of a method according to the first aspect of the present disclosure the stress relief islands may have a stress relief island pattern that fully covers the corresponding component island pattern. In such embodiments, the stress relief island may have the same pattern as the corresponding component island pattern or it may have a different pattern, e.g. a pattern that is larger than and extends beyond the corresponding component island pattern.

In embodiments of a method according to the first aspect of the present disclosure, the patterned supporting layer may be a thermo-formable layer, such as a thermosetting layer (for example a polyimide layer), a fully cured thermosetting layer, or a thermoplastic layer, the present disclosure not being limited thereto. In other embodiments of a method according to the first aspect of the present disclosure, the patterned supporting layer may be a non-thermo-formable layer such as for example a inorganic layer such as for example an oxide layer, e.g. a silicon oxide or an aluminum oxide layer, or for example a nitride layer, e.g. a silicon nitride layer, the present disclosure not being limited thereto. The patterned supporting layer is may be an electrically insulating layer. It may also be a flexible layer.

In embodiments of a method according to the first aspect of the present disclosure, for at least part of the second pattern, boundary lines (border lines, perimeter lines) of the second pattern may be substantially coincident with boundary lines (border lines, perimeter lines) of the first pattern.

In embodiments of a method according to the first aspect of the present disclosure, for at least part of the second pattern, boundary lines (border lines, perimeter lines) of the second pattern may be different from boundary lines (border lines, perimeter lines) of the first pattern. For example, boundary lines of the second pattern may extend beyond boundary lines of the first pattern. For example, boundary lines of the second pattern may at least partially be located between boundary lines of the first pattern.

In embodiments of a method according to the first aspect of the present disclosure, defining the second pattern may comprise inserting a first stress relief island and a second stress relief island and defining the second pattern may further comprise inserting at least one line-shaped or beam-shaped relief element between the first stress relief island and the second stress relief island, wherein the at least one line-shaped or beam-shaped stress relief element forms a connection between the first stress relief island and the second stress relief island. In embodiments according to the first aspect of the present disclosure such line-shaped or beam-shaped stress relief elements may or may not function as a stress relief interconnection track. For example, such line-shaped or beam-shaped stress relief elements may have a mechanical function without being directly related to a component interconnection track or pattern.

In embodiments of a method according to the first aspect of the present disclosure, the line-shaped or beam-shaped stress relief elements may have straight boundary lines, non-straight boundary lines or a combination of straight and non-straight boundary lines.

In embodiments of a method according to the first aspect of the present disclosure the non-flat device may comprise a surface having a non-developable shape, such as for example a surface having a spherical shape, the present disclosure not being limited thereto.

In embodiments of a method according to the first aspect of the present disclosure wherein the non-flat device comprises a surface having a spherical shape, at least part of the at least one line-shaped or beam-shaped stress relief elements may be oriented along a longitudinal line (meridional line) of the spherical shape. Further, at least part of the at least one line-shaped or beam-shaped stress relief elements may be oriented along a latitudinal line (e.g. circumferential line or line substantially parallel to circumferential line) of the spherical shape.

In a second aspect, the present disclosure is related to a method of manufacturing a shape-retaining non-flat device by deformation of a flat device, wherein the flat device is attached before deformation to a stress relief layer, the stress relief layer having a pattern that is designed in accordance with the first aspect of the present disclosure. In some embodiments, the flat device is a thermo-formable flat device, deformation of the flat device comprises deformation by a thermoforming process, and the patterned stress relief layer is a thermoplastic layer.

A method of manufacturing a shape-retaining non-flat device by deformation of a flat device, the non-flat device comprising at least two components and at least one electrical interconnection between two components, in accordance with embodiments of the second aspect of the present disclosure comprises: obtaining a second pattern of a stress relief layer according to any of the previous claims; obtaining the flat device; providing a stress relief layer comprising a layer of thermoplastic material; mechanically attaching the flat device to the stress relief layer; and patterning the stress relief layer according to the second pattern.

The method of manufacturing a shape-retaining non-flat device by deformation of a flat device in accordance with a method of the second aspect of the present disclosure may further comprise deforming the stress relief layer with the flat device attached thereto into the non-flat device by a thermoforming process using a mold having a shape corresponding to the shape of the non-flat device.

In embodiments of a method according to the second aspect of the present disclosure, mechanically attaching the flat device to the stress relief layer may be done before patterning the stress relief layer. In other embodiments of a method according to the second aspect of the present disclosure, mechanically attaching the flat device to the stress relief layer may be done after patterning the stress relief layer.

In embodiments of a method according to the second aspect of the present disclosure, mechanically attaching the flat device to the stress relief layer may comprise laminating the flat device with the stress relief layer.

In embodiments of a method according to the second aspect of the present disclosure, mechanically attaching the flat device to the stress relief layer may comprise embedding the flat device between a first stress relief layer and a second stress relief layer. In such embodiments patterning the stress relief layer according to the second pattern comprises patterning the first stress relief layer and the second stress relief layer according to a second pattern. In such embodiments, the second pattern of the first stress relief layer and the second pattern of the second stress relief layer may be substantially the same or they may be different.

In embodiments of a method according to the second aspect of the present disclosure, patterning the stress relief layer according to the second pattern may comprise patterning by means of laser ablation, the present disclosure not being limited thereto.

Some embodiments of the present disclosure allow the stress acting on the flat device (and thus on the circuit) during the thermoforming process to be distributed more evenly as compared to known methods. Distributing stress more evenly reduces the local stress acting on the device during the thermoforming process substantially. Further, distributing the stress more evenly allows the shape of the non-flat device to be better controlled.

For example, the reduced local stress allows the amount of compressive stress to be substantially reduced such that buckling or the formation of wrinkles as a result of the thermoforming process may be substantially reduced or avoided. For the specific example of smart contact lenses fabricated by means of a thermoforming process, wherein the device circuit comprises an antenna being provided near an outer edge of the contact lens, the embodiments of the present disclosure allow for the formation of wrinkles in or near the antenna to be substantially reduced or avoided.

For example, the reduced local stress allows for the stress acting on the components or component islands being part of the device to be reduced and/or can be controlled to be lower than the tensile strength of the materials used. For example, in embodiments wherein the components comprise silicon integrated circuits, stress levels can be controlled to be lower than the tensile strength of silicon. This allows bending of the components without breaking them.

Further, embodiments of the present disclosure allow for the stress acting on the non-flat device (and thus on the circuit after being thermoformed) during use of the non-flat device to be distributed more evenly. Distributing stress more evenly allows the local stress acting on the device during its use to be substantially reduced as compared to known approaches.

Some embodiments of the present disclosure allow for the resulting shape-retaining non-flat 2.5D device to be a rigid, flexible, or stretchable structure. For example, after removal from the thermoforming tool, the non-flat device may keep the 2.5D shape ('shape-retaining') corresponding to the shape of the mold used during the thermoforming process but it may still be flexible or stretchable due to the patterning of the stress relief layer and of the supporting layer. A flexible or stretchable (non-flat) structure or device that it may have a better mechanical robustness as compared to a rigid (non-flat) structure or device. For example, when using a method according to an embodiment of the present disclosure for forming a contact lens, the contact lens allows some flexibility and extensibility when inserting it into or removing it from the eye.

In embodiments of the present disclosure the device may for example comprise an electronic component, an antenna, a photonic component, an optical component, an electro-optical component, a sensor and/or a physical or chemical transducer, the present disclosure not being limited thereto.

A method according to embodiments of the present disclosure may be used for fabricating shape-retaining non-flat devices comprising a surface having a non-developable shape, such as for example a spherical shape, the present disclosure not being limited thereto.

A method according to embodiments of the present disclosure may be used for fabricating smart contact lenses, such as multifocal contact lenses, artificial iris implementations, lenses for intraocular pressure monitoring, for biochemical real time monitoring, or for electromagnetic radiation sensing, the present disclosure not being limited thereto.

A method according to embodiments of the present disclosure may be used for fabricating on-the-body or wearable devices such as for example patches or labels, the present disclosure not being limited thereto.

Particular aspects of the disclosure are set out in the accompanying independent and dependent claims. Features from the dependent claims may be combined with features of the independent claims and with features of other dependent claims as appropriate and not merely as explicitly set out in the claims.

The above and other characteristics, features of the present disclosure will become apparent from the following detailed description, taken in conjunction with the accompanying drawings, which illustrate, by way of example, the principles of the disclosure. This description is given for the sake of example only, without limiting the scope of the disclosure. The reference figures quoted below refer to the attached drawings.

BRIEF DESCRIPTION OF THE FIGURES

FIGS. 13(a)-(d) schematically illustrate an example of a non-flat device in accordance with an embodiment of the present disclosure.

FIG. 13(a) and FIG. 13(b) show a perspective view of the non-flat device, according to an embodiment of the present disclosure.

FIG. 13(c) shows a top view of the device, according to an embodiment of the present disclosure.

FIG. 13(d) shows a schematic representation of some elements of a second pattern of a stress relief layer in accordance with an embodiment of the present disclosure.

Figure 1:
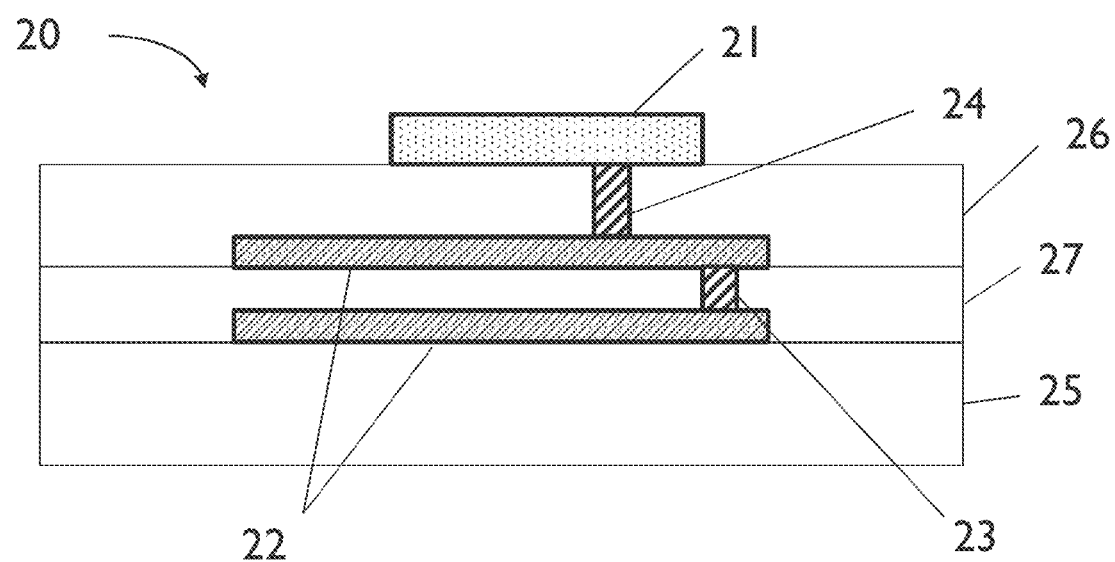
FIG. 1 schematically illustrates a cross section of an example of a flat device that may be used in a method according to an embodiment of the present disclosure.

In the different figures, the same reference signs refer to the same or analogous elements.

DETAILED DESCRIPTION

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

The terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of the embodiments of the disclosure, various features of the disclosure are sometimes grouped together in a single embodiment, figure, or description thereof for the purpose of streamlining the disclosure and aiding in the understanding of one or more of the various aspects. This method of disclosure, however, is not to be interpreted as reflecting an intention that the claimed disclosure requires more features than are expressly recited in each claim. Rather, as the following claims reflect, some aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

The following terms are provided solely to aid in the understanding of the disclosure.

In the context of the present disclosure, a 2.5D structure or 2.5D shaped device is a structure or device that is non-flat. Such a structure or device has at least one non-flat surface such as a curved surface. In the context of the present disclosure, '2.5D structure' or '2.5D device' and 'non-flat structure' or 'non-flat device' are interchangeably used to refer to such structures or devices. 2.5D structures are different from 2D (flat, planar) structures and they are different from 3D structures (volumes). A 2.5D structure may for example be seen as corresponding to a shell or a surface layer of a 3D structure. Typically, the thickness of such shell or surface layer is substantially smaller (e.g. in the range between less than 0.1 mm and 5 mm) than its lateral dimensions (which may for example be in the range of 1 centimeter to tens of centimeters), the present disclosure not being limited thereto.

In the context of the present disclosure, flexible means non-stiff, non-rigid, i.e. able to bend without breaking, but not stretchable. A flexible structure is adapted to be deformable in a certain direction during normal use of the structure, but does not elongate.

In the context of the present disclosure, stretchable means resilient, i.e. elastically deformable with elongation. A stretchable structure is adapted to be elastically deformable (with elongation) during normal use, under an applied force and to return substantially to its original shape, substantially without permanent deformation, when the applied force is relaxed. A stretchable structure can be made out of non-stretchable materials, such as flexible materials or even rigid materials. An example is a metallic spring. The metal in itself is a rigid bulk material but the shaping of the material leads to a certain degree of flexibility and even a certain degree of stretchability.

In the context of the present disclosure, rigid means stiff, i.e. not able to bend or highly resistant to bending.

In the context of the present disclosure, mechanically deformable means flexible or stretchable. In the context of the present disclosure, a mechanically deformable structure or circuit is a structure or circuit that may be deformed without breaking it and without damaging it. A mechanically structure or circuit may comprise stretchable and/or flexible elements and it may in addition also comprise parts that are rigid or semi-rigid. For example, in embodiments of the present disclosure a mechanically deformable structure or circuit may comprise stretchable or flexible interconnections, flexible component islands and rigid integrated circuits or semi-rigid integrated circuits (e.g. thin silicon chips).

In the context of the present disclosure, a thermoplastic material is a material that becomes pliable or moldable above a specific temperature (the glass transition temperature of the material) and solidifies upon cooling. Above its glass transition temperature and below its melting point the physical properties of a thermoplastic material change without an associated phase change.

In the context of the present disclosure, a thermoset or a thermosetting material is a pre-polymer in a soft solid or viscous state that changes irreversibly into an infusible, insoluble polymer network by curing, e.g. by heating. Examples of thermosetting materials are epoxies and some poly-urethanes.

In the context of the present disclosure, a thermo-formable material is a material that may be formed into a predetermined solid shape, e.g. a non-flat solid shape, by means of a thermoforming process comprising heating, shaping and cooling. Examples of thermo-formable materials are thermoplastic materials, such as thermoplastic polymers, some uncured or partially cured thermosetting materials such as epoxies, and composite materials comprising a thermoplastic or a thermosetting material. Some non-limiting examples of thermo-formable composite materials are mats or fabrics impregnated with a thermoplastic or thermosetting material, such as for example a carbon fiber mat impregnated with an epoxy; a thermoplastic or thermosetting material with embedded (nano-sized) elements, such as for example a polyurethane with embedded metal (e.g. Ag) nanowires; or a coated thermoplastic or thermosetting material, such as for example a polystyrene with a metal coating.

In the context of the present disclosure, a shape-retaining device means a device that retains or keeps its given shape in the absence of external forces. More in particular, in the context of the present disclosure a shape-retaining non-flat (2.5D) device refers to a thermo-formed non-flat device that, in the absence of external forces, retains the shape of the mold used for thermoforming after the device has been removed from the thermoforming tool. Such a device may be a rigid device, a flexible device or a stretchable device.

In the context of the present disclosure, a non-developable surface is a surface that cannot be flattened onto a plane without distortion (e.g. without stretching or without compressing).

The disclosure will now be described by a detailed description of several embodiments of the disclosure. It is clear that other embodiments of the disclosure can be configured according to the knowledge of persons skilled in the art without departing from the technical teaching of the disclosure, the disclosure being limited only by the terms of the appended claims.

When fabricating a non-flat device by deformation of a flat device, e.g. by means of a thermoforming process, the transformation of a flat surface shape into a non-flat surface shape involves local stretching and/or compressing of at least parts of the flat device, depending on the developed levels of stress and/or strain in the device structure during the deformation process.

In embodiments of the present disclosure a patterned stress relief layer is designed and mechanically attached to the flat device before deformation, wherein the stress relief layer is designed to have a pattern that allows reducing the undesired effects of stretching. More in particular, the stress relief layer is designed to have a pattern that allows keeping the level of mechanical stress related to stretching sufficiently low, specifically lower than the tensile strength of the materials being part of, e.g. constituting, the flat device or circuit.

The effect of compression is different from the effect of stretching and may be more problematic. Compression may lead to crumpling of the materials of the device or circuit and of the stress relief layer, e.g. thermoplastic material layer, resulting in folding or the formation of wrinkles in parts of the non-flat device. This effect may be most pronounced at or near outer edges of the device, where compression levels may be largest, for example when transforming a flat disk-shaped or ring-shaped device into a non-flat device having a (partial) spherical cap shape. The wrinkles formed in the materials are mainly related to the compressive stress in the circumferential direction, and substantially less to compressive stress that may occur in the radial direction. Compressive stress in the circumferential direction is related to the amount of reduction in length of the outer perimeter of the structure as a result of the deformation process, e.g. thermoforming process. This reduction in the length of the outer perimeter occurs when the device is pulled to the center of deformation.

The circumferential compressive stress may be reduced by reducing the amount of deformation resulting from the thermoforming process. In embodiments of the present disclosure the local compressive stress is further reduced by distributing the generated stress over the structure more evenly. More in particular, distributing the compressive stress is obtained in embodiments of the present disclosure by mechanically attaching to the flat device a patterned layer of stress relief material, more in particular a patterned layer of thermoplastic material, before performing the deformation into a non-flat device. In embodiments of the present disclosure the patterned stress relief layer is designed to have a pattern that allows reducing the undesired effects of compressive stress, in particular circumferential compressive stress, such that folding and/or the formation of wrinkles in the non-flat device is substantially reduced or avoided.

Based on Finite Element Modeling simulations of the stresses related to a thermoforming process of a thermoplastic disk and of a ring of thermoplastic material, and based on experiments, it was shown that compressive stress indeed results in the formation of wrinkles when such a disk is transformed into a cap-shaped structure, especially in the outer regions of the disk structure. For the ring shaped structure much lower stress levels were found based on the simulations, leading to no or substantially less wrinkles being formed as compared to the disk shaped structure. This indicates that in such a case it may be more appropriate to use a ring-shaped structure rather than a disk shaped structure, provided that such structure is compatible with the intended application. As further described, additional patterning of the stress relief layer may lead to a further reduction of wrinkle formation.

In methods according to embodiments of the present disclosure, two main elements are provided. More in particular, methods according to embodiments of the present disclosure comprise providing at one hand a flat device (or a layout of a flat device) and at the other hand a stress relief layer. In some embodiments, the stress relief layer is a layer of thermoplastic material. In the further description, the combination of these two main elements, i.e. the flat device and the stress relief layer, is also referred to as a 'platform'.

In embodiments of the present disclosure the flat device is a mechanically deformable device. The flat device comprises a circuit, such as for example an electronic circuit or an opto-electronic circuit, comprising at least two components and at least one electrical interconnection between two components. The components may for example be active or passive components, integrated circuits, e.g. thinned integrated circuits (for example having a thickness less than 50 micrometer or less than 30 micrometer), electro-optic components or biochemical sensors, the present disclosure not being limited thereto. The at least one electrical connection between components is formed by providing a patterned electrically conductive layer between components. The patterned electrically conductive layer may also be provided for forming contact pads or for forming an integrated component such as for example an integrated antenna structure.

The flat device further comprises a patterned supporting layer, the patterned supporting layer having a first pattern comprising component islands (e.g. for mechanically supporting components that are part of the device) having a component island pattern and comprising at least one component interconnection track (e.g. for mechanically supporting electrical interconnections between components) having a component interconnection pattern. The patterned supporting layer may be a flexible layer, and an electrically insulating layer. A component island pattern covers at least an area corresponding to the location of at least one component of the circuit, and a component interconnection pattern covers at least an area corresponding to the location of an electrical interconnection. Examples of such a patterned supporting layer are disclosed in U.S. Pat. No. 9,247,648. The patterned supporting layer provides mechanical support to the components and electrical interconnections and it provides mechanical protection of the components and interconnections during deformation. In some embodiments of the present disclosure the patterned supporting layer comprises at least one layer of thermosetting material, for example a polymer layer such as a polyimide layer, including a fully cured layer of thermosetting material. A fully cured thermoset supporting layer allows for protection of the mechanical integrity of components, interconnections and joints (e.g. solder joints) during the deformation from a flat device into a non-flat device. The patterned supporting layer may also comprise a thermoplastic material, for example a parylene-C photoresist layer, the present disclosure not being limited thereto. In embodiments wherein the supporting layer is a thermoplastic layer, it has a glass transition temperature higher than the glass transition temperature of the thermoplastic stress relief layer. The flat device may be fully or substantially embedded in or fully or substantially enclosed by thermo-formable material. The patterned supporting layer may also comprise an inorganic layer such as an oxide layer or a nitride layer.

FIG. 1 schematically illustrates a cross section of an example of a flat device (mechanically deformable device) 20 that may be used in embodiments of the present disclosure. In the example shown, the flat device 20 comprises two patterned electrically conductive layers 22 embedded between a first electrically insulating layer 25, e.g. a first polymer layer, and a second electrically insulating layer 26, e.g. a second polymer layer, the electrically conductive layers 22 being separated from each other by an intermediate electrically insulating layer 27, e.g. an intermediate polymer layer. The electrically conductive layers 22 are electrically connected to each other by a via 23 through the intermediate insulating layer 27. The flat device 20 further comprises a component 21 being provided on the second insulating layer 26 and electrically connected to the embedded electrically conductive layers 22 by means of a via 24 through the second insulating layer 26. In the example shown, component 21 is an 'external' component, i.e. it is not embedded between layers 25 and 26. However, the present disclosure is not limited thereto and the flat device may also comprise 'internal' or 'embedded' components that are provided between layers 25 and 26. For example, an electrically conductive layer 22 may be designed and patterned such that it forms an embedded component such as for example an embedded antenna structure, e.g. RF antenna, an embedded resistor, an embedded capacitor or an embedded inductance, the present disclosure not being limited thereto. Such components may also be provided as external components instead of embedding them between layers 25 and 26. An electrically conductive layer 22 may also be patterned to form for example a contact pad for a component or to form an electrode, e.g. for a sensor, the present disclosure not being limited thereto. The example of FIG. 1 shows a flat device 20 comprising two patterned electrically conductive layers 22. However, the present disclosure is not limited thereto and the flat device may instead comprise only one electrically conductive layer 22 or more than two electrically conductive layers.

In embodiments of the present disclosure the electrically insulating layers may be used as, i.e. they may have the function of, a supporting layer as described above. Examples of electrically insulating polymer layers that may be used are polyimide layers, parylene-C layers and photoresist layers. Examples of electrically insulating inorganic layers that may be used are oxide layers, such as silicon oxide or aluminum oxide layers, and nitride layers, such as silicon nitride layers. These electrically insulating layers are patterned according to a first pattern, the first pattern comprising component islands (e.g. for mechanically supporting components that are part of the device) and component interconnection tracks (e.g. for mechanically supporting electrical interconnections between components), as described above.

In embodiments of the present disclosure the component 21 may for example be or comprise an electronic component, an integrated or a discrete component, an integrated circuit (e.g. silicon based or foil based), a photonic component, an electro-optical element, a physical or chemical transducer, or an energy storage device such as a thin film battery, the present disclosure not being limited thereto.

The component may be rigid, flexible or stretchable. The mechanically deformable flat device 20 may comprise more than one component, e.g. a plurality of components.

The electrically conductive layers 22 may comprise an inorganic electrically conductive material such as a metal (e.g. Au, Cu, Ag. . . . , bulk material or particle-based material, nanoparticles or nanotubes) or an organic electrically conductive material such as an electrically conductive polymer. In particular in embodiments wherein a metal is used as the electrically conductive material the patterned electrically conductive layers 22 may have a non-straight shape, e.g. a meandering shape, to allow mechanical deformation, i.e. to render the circuit stretchable in the plane of the electrically conductive layer 22. However, the present disclosure is not limited thereto and straight shapes, or a combination of non-straight (e.g. curved or meandering) and straight shapes may also be used. In embodiments wherein an organic electrically conductive material (e.g. a polymer) is used as the electrically conductive material, a stretchable conductive material may be used such that there may be no need for providing non-straight (e.g. meandering) conductive layers.

Figure 2:
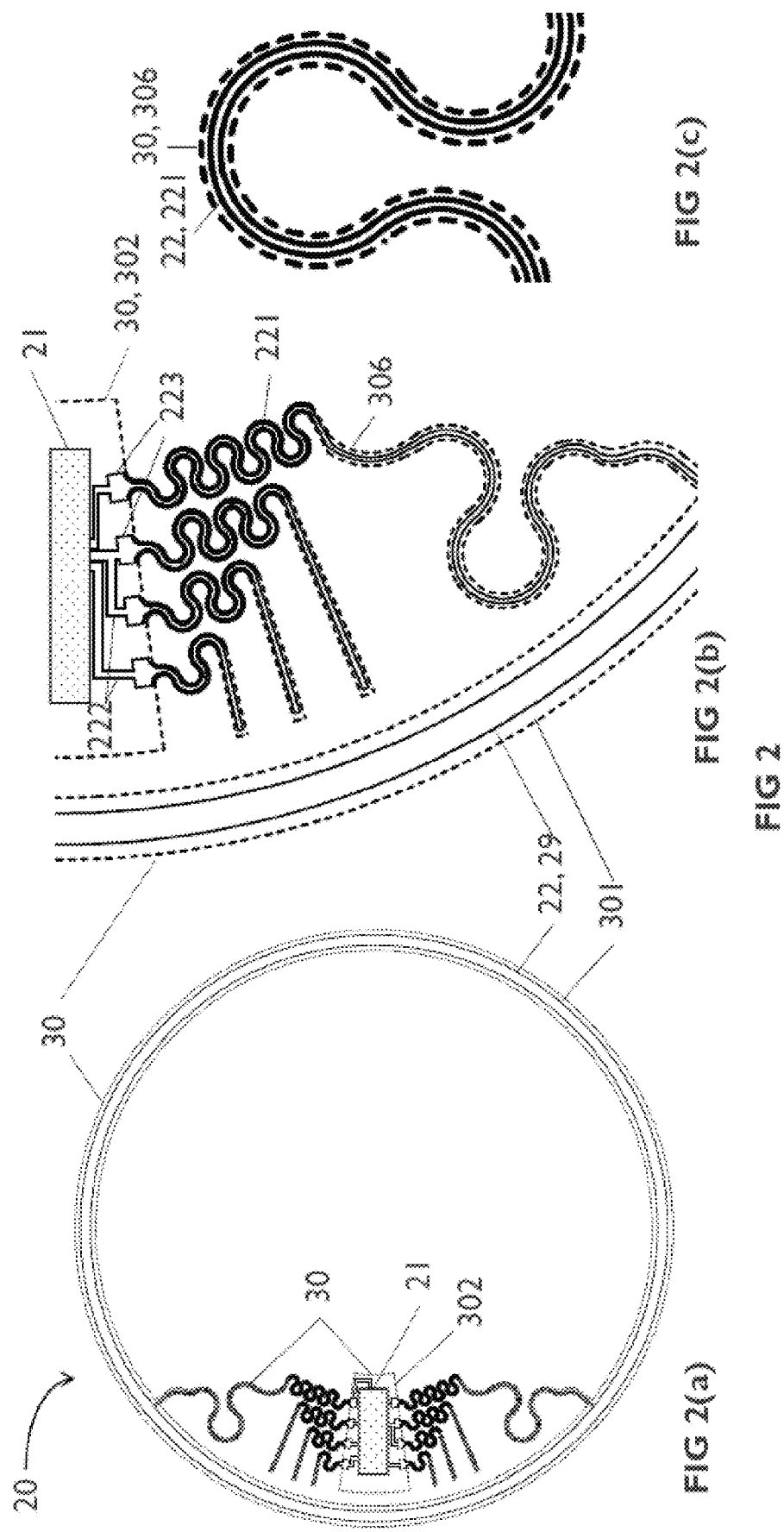
FIG. 2(a) schematically shows a top view of an example of a layout of a flat device that may be used in a method according to an embodiment of the present disclosure.
FIG. 2(b) schematically shows enlarged, detailed parts of the device shown in FIG. 2(a), according to an embodiment of the present disclosure.
FIG. 2(c) schematically shows enlarged, detailed parts of the device shown in FIG. 2(a), according to an embodiment of the present disclosure.

FIG. 2(a) schematically shows a top view of an example of a layout of a flat device 20 that may be used in a method according to an embodiment of the present disclosure. FIG. 2(b) and FIG. 2(c) schematically show enlarged, detailed parts of the device shown in FIG. 2(a). More in particular, FIG. 2 shows an example of a flat device that may be used in a method in accordance with the present disclosure wherein the non-flat device to be formed by deformation of the flat device 20 is a contact lens, e.g. a smart contact lens. The mechanically deformable flat device 20 comprises a patterned supporting layer 30 (dashed lines in FIG. 2), the patterned supporting layer 30 having a first pattern and being provided for mechanically supporting components and interconnections. The patterned supporting layer 30 may for example correspond to the electrically insulating polymer layers 25, 26, 27 of the flat device as shown in FIG. 1, the present disclosure not being limited thereto. In the example shown in FIG. 2 the supporting layer 30 (dashed lines) is patterned according to a first pattern. In the example shown, the first pattern comprises a circular ring-shaped part near an outer perimeter of the device. This circular ring-shaped part is an example of a component island (first component island 301): it is provided for mechanically supporting an embedded antenna 29 (circular, solid lines in FIG. 2) of the flat device 20. In the example shown the antenna 29 has a circular shape, but the present disclosure is not limited thereto. For example, the antenna 29 may also have another shape such as a polygonal shape such as a hexagonal shape or a square shape, or for example an oval shape or a meandering shape, the present disclosure not being limited thereto.

In the example shown, the first pattern of the supporting layer 30 further comprises a second component island 302, the second component island 302 being provided for mechanically supporting a component 21 of the flat device 20. The second component island 302 also supports a fan-out metallization pattern 222 and contact pads 223, being provided for electrical coupling between the component 21 and electrical interconnections 221. In the example shown, the first pattern of the supporting layer 30 further comprises component interconnection tracks 306 mechanically supporting the electrical interconnections 221. In the example shown in FIG. 2, the electrical interconnections 221 and the corresponding component interconnection tracks 306 have a pattern that is a combination of non-straight, e.g. meandering parts, and substantially straight parts. This is only an example, and other configurations are possible. The first pattern of the supporting layer 30 also provides a connection between the first component island 301 and the second component island 302.

In some embodiments, the supporting layer 30 fully supports the components and the electrical interconnections and extends beyond edges or borders of the components and the electrical interconnections. This can for example be seen in FIG. 2(b), wherein the first component island 301 extends beyond edges of the antenna 29 and the second component island 302 extends beyond the edges of component 21. FIG. 2(c) illustrates component interconnection tracks 306 having lateral edges extending beyond lateral edges of the electrical interconnections 221. In the embodiment illustrated in FIG. 2 only one component 21 is present on second component island 302. However, the present disclosure is not limited thereto, and more than one component may be present on a single component island.

Figure 3:
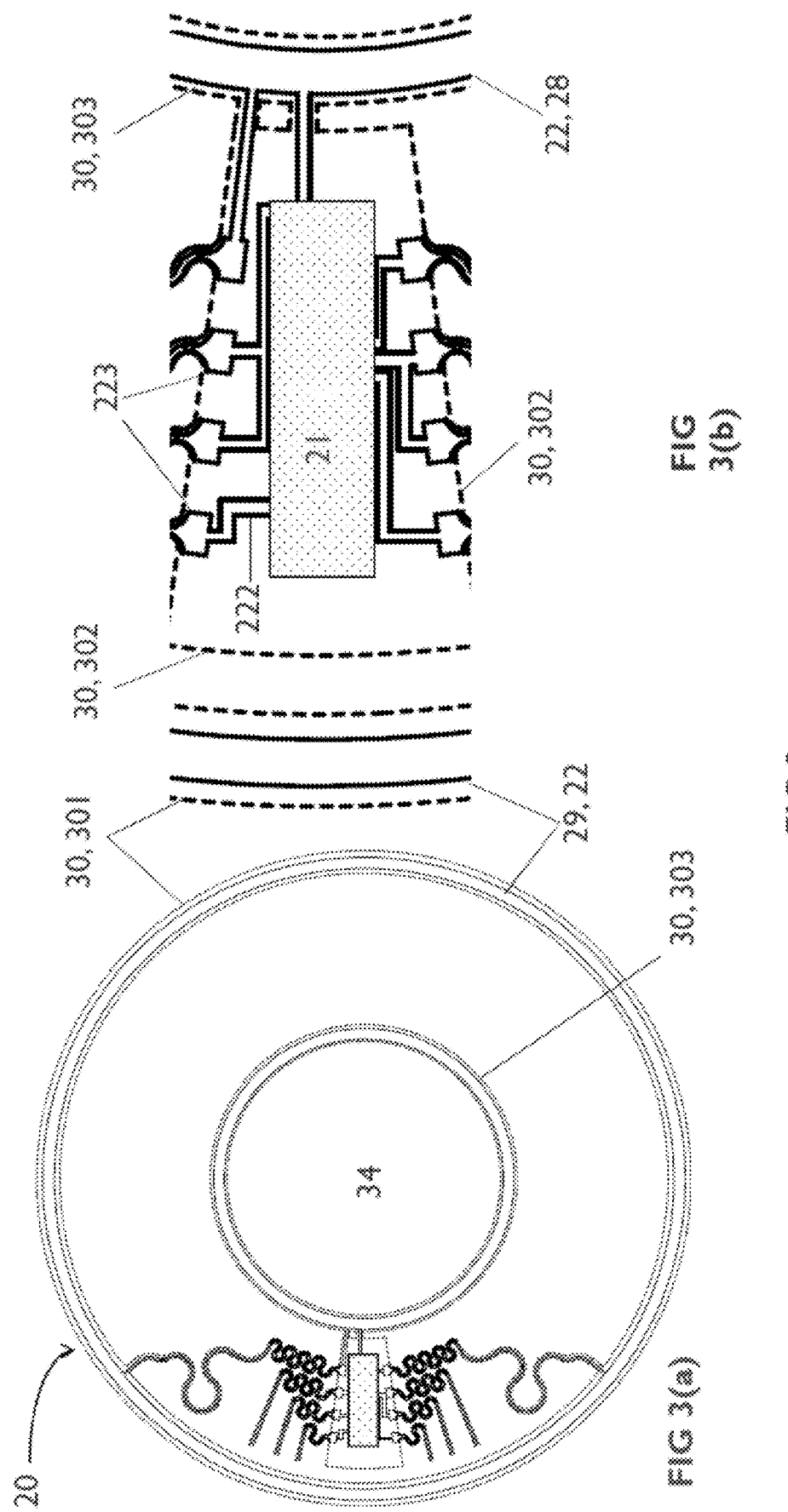
FIG. 3(a) schematically shows a top view of an example of a layout of a flat device that maybe used in a method according to an embodiment of the present disclosure.
FIG. 3(b) schematically shows an enlarged, detailed part of the device shown in FIG. 3(a), according to an embodiment of the present disclosure.

FIG. 3(a) schematically shows a top view of another example of a layout of a mechanically deformable flat device 20 that may be used in a method according to an embodiment of the present disclosure. FIG. 3(b) schematically shows an enlarged, detailed section of the flat device 20 shown in FIG. 3(a). More in particular, FIG. 3 shows an example of a device 20 that may be used in a method in accordance with the present disclosure wherein the non-flat device to be formed is a contact lens, e.g. a smart contact lens, wherein additional components, such as for example opto-electronic components, may be integrated in a central part of the contact lens. The embodiment shown in FIG. 3 comprises the same or similar elements as the embodiment shown in FIG. 2 and some additional elements. In the example shown, the first pattern of the supporting layer 30 comprises a third component island 303. In the example shown the third component island 303 has a ring shape, with a central opening 34. The third component island 303 is connected to the other parts of the patterned thermo-formable layer 30. The third component island 303 may for example be provided for supporting an additional component such as for example an antenna 28 (as illustrated in FIG. 3(b)), or for example for supporting only peripheral regions of an additional component such as an electro-optic component (not illustrated), e.g. a Liquid Crystal Display. Another application wherein the supporting layer 30 is not fully supporting or fully embedding a component and wherein the supporting layer 30 has an opening 34 is an embodiment wherein the component is for example a sensor that requires an access window, such as for example a chemical sensor. In embodiments wherein the non-flat device to be formed is a contact lens, the presence of a central opening 34 may allow oxygen access to the eyes. The component supported by the third component island 303 is electrically connected to other elements of the device, e.g. to another component of the device.

In the embodiment shown in FIG. 3, additional components may be integrated at the location of the central opening 34, and connected, e.g. electrically connected, to the circuit. In the example of a contact lens, the location of the central opening 34 may cover an area wherein a pupil is located when wearing the contact lens. For example, electro-optical elements such as an LCD display may be integrated at the location of the central opening 34. In combination with the circuit, e.g. comprising a thin-film circuit, a silicon based integrated circuit, and/or an antenna, e.g. RF antenna, a full solution may be provided as a smart contact lens for vision correction applications.

In embodiments of the present disclosure the flat device 20 is attached to a stress relief layer (layer of thermoplastic material) before its deformation into a non-flat device, wherein the stress relief layer is patterned according to a second pattern before deformation. The stress relief layer is provided as a flat layer (e.g. a substrate) comprising at least one thermoplastic material such as e.g. thermoplastic polyurethane, polyethylene terephthalate (PET), polyethylene naphthalate (PEN), poly lactic acid (PLA), parylene-C, polycarbonate (PC), poly copolymers (PLGA), or permanent photoresists, the present disclosure not being limited thereto. It may comprise a single thermoplastic layer or it may comprise a stack of at least two thermoplastic layers. Thermoplastic materials with a relatively low glass transition temperature are used, such as for example materials having a glass temperature lower than 150° C., such as for example a glass transition temperature in the range between 40° C. and 125° C., the present disclosure not being limited thereto.

In a method according to embodiments of the present disclosure the initially flat layer of thermoplastic material (stress relief layer) is mechanically attached to the flat device, prior to deformation, and the resulting platform is then transformed into a non-flat (2.D) shape by means of a thermoforming process. In the non-flat device that is fabricated in such a way, the insulating supporting layers (e.g. polymer layers, e.g. layers of thermosetting material) of the device serve to mechanically support the components and interconnections of the circuit, protect them and to hold them in place. These layers are patterned according to the first pattern and they have the function of (mechanical) supporting and protection layers. The stress relief layer (layer of thermoplastic material) allows performing the thermoforming step without damaging the circuit or with a reduced risk of damaging the circuit, thanks to its reduced viscosity when heated and thanks to its low glass transition temperature. The layer of thermoplastic material is patterned according to a second pattern and has the function of local mechanical stress relief (local stress reduction) and/or mechanical stress redistribution during the thermoforming process and also afterwards, e.g. during use of the non-flat device. The thermoplastic material allows for adhesion to the outer material of the device (e.g. a polymer), so that both may be laminated at relatively low temperatures to mechanically connect them, i.e. to attach the layer of thermoplastic material and the device to each other. For example, the lamination temperature may be in the range between 80° C. and 150° C., the present disclosure not being limited thereto. For example, when using a thermoplastic polyurethane (TPU) in combination with a circuit having a polyimide as an outer material layer, adhesion between both was obtained. In general, TPU enables adhesion to many polymers if the lamination is performed at a temperature above its glass transition temperature. In embodiments of the present disclosure, dedicated adhesion layers may be used to improve adhesion between the thermoplastic material and the circuit. The device may be attached to a layer of thermoplastic material or it may be embedded between layers of thermoplastic stress relief material.

In a method according to embodiments of the present disclosure, the layer of thermoplastic material and the circuit are fabricated and provided as a flat (2D) structure and they are transformed into a non-flat (2.5D) structure by means of a thermoforming process. The platform may have any in-plane shape. In embodiments wherein the non-flat device to be formed is for example a contact lens or a part of a contact lens the mechanically deformable circuit may have a disk shape or a ring shape. In general, the non-flat device to be formed may have or comprise any non-developable shape, i.e. it may have a non-developable surface (non-zero Gaussian surface). This means that such a non-flat device cannot be created from a plane without distortion (i.e. stretching or compressing).

In a first aspect, the present disclosure relates to a method for designing a pattern of a stress relief layer for a flat device to be transformed into a shape-retaining non-flat device by deformation of the flat device. The flat device (and thus also the non-flat device) may comprise at least two components and at least one electrical interconnection between two components. In some embodiments deformation of the flat device comprises deformation by means of a thermoforming process.

In a second aspect, the present disclosure is related to a method of manufacturing a shape-retaining non-flat device by deformation of a flat device, wherein the flat device is attached to a patterned stress relief layer designed in accordance with the first aspect of the present disclosure. In some embodiments, the stress relief layer is a thermoplastic layer or a layer comprising a thermoplastic material and deformation of the flat device comprises deformation by a thermoforming process, after attachment of the flat device to the stress relief layer.

In the first aspect, the present disclosure provides a method for designing a pattern of a stress relief layer for a flat device to be transformed into a shape-retaining non-flat device by deformation of the flat device, the flat device comprising at least two components and at least one electrical interconnection between two components. A method according to an embodiment of the first aspect comprises: providing a layout of the flat device, the layout comprising the at least two components and the at least one electrical interconnection, the layout further comprising a patterned supporting layer, including a flexible electrically insulating supporting layer, having a first pattern comprising at least one component island and at least one component interconnection track, the at least one component island having a component island pattern covering at least an area corresponding to the location of at least one component, and the at least one component interconnection track having a component interconnection pattern covering at least an area corresponding to the location of an electrical interconnection; and defining a second pattern at least partially, e.g. substantially, covering the first pattern, the second pattern being the pattern of the stress relief layer. In embodiments of the present disclosure, defining the second pattern comprises inserting a stress relief island for each component island, the stress relief island having a stress relief island pattern at least partially, e.g. substantially, covering the corresponding component island pattern. In embodiments of the present disclosure, defining the second pattern may further comprise inserting a stress relief interconnection track for at least one component interconnection track, the stress relief interconnection track having a stress relief interconnection pattern fully covering the corresponding component interconnection pattern. In embodiments of the present disclosure, defining the second pattern may further comprise inserting a stress relief island for at least two component interconnection track, the stress relief island having a stress relief island pattern fully covering the corresponding at least two component interconnection patterns.

Figure 4:
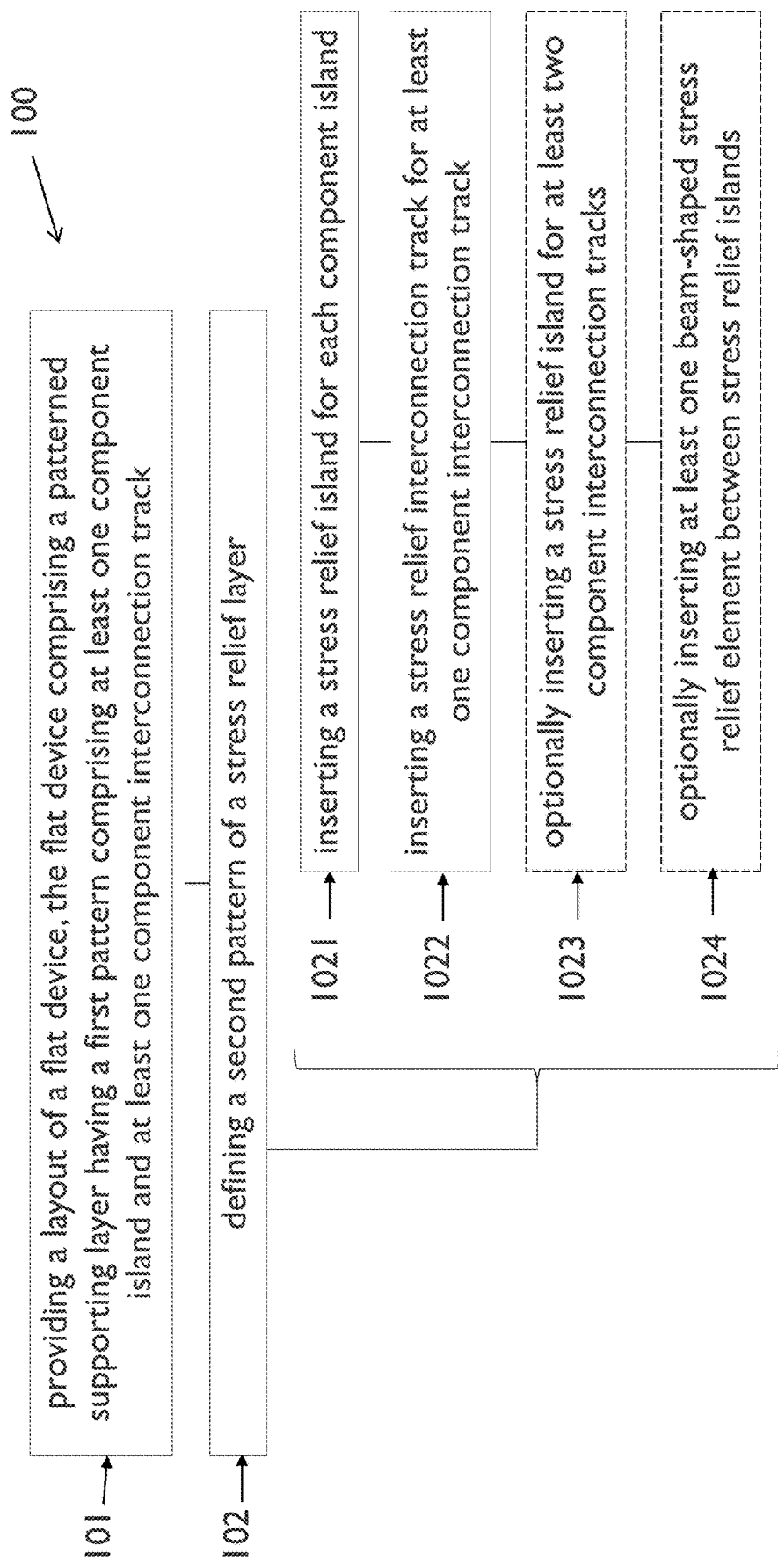
FIG. 4 schematically shows an example of a design flow in accordance with an embodiment of the first aspect of the present disclosure.

FIG. 4 schematically shows an example of a design flow of a method 100 for designing a pattern of a stress relief layer in accordance with an embodiment of the first aspect of the present disclosure. A patterned stress relief layer designed in accordance with the first aspect of the present disclosure is to be combined with (mechanically attached to) a flat device, the flat device being provided to be transformed into a shape-retaining non-flat device by deformation, such as for example deformation by means of thermo-forming process.

The method 100 illustrated in FIG. 4 comprises providing (FIG. 4, step 101) a layout of the flat device for which the pattern of the stress relief layer is to be designed. In embodiments of the present disclosure, the layout of the device comprises at least two components and at least one electrical interconnection between two components. The layout of the flat device further comprises a patterned supporting layer having a first pattern comprising at least one component island and at least one component interconnection track, the at least one component island having a component island pattern and the at least one component interconnection track having a component interconnection pattern.

Taking into account the layout of the flat device, a second pattern of the stress relief layer is defined (FIG. 4, step 102). Defining (102) the second pattern of the stress relief layer comprises: inserting (FIG. 4, step 1021) a stress relief island for each component island, the stress relief island having a stress relief island pattern at least partially covering the corresponding component island pattern; and inserting (FIG. 4, step 1022) a stress relief interconnection track for at least one component interconnection track, the stress relief interconnection track having a stress relief interconnection pattern fully covering the corresponding component interconnection pattern.

In embodiments a stress relief island pattern may partially, e.g. substantially, cover the corresponding component island pattern. In embodiments a stress relief island pattern may fully cover the corresponding component island pattern. In such embodiments, the stress relief island may have the same pattern as the corresponding component island pattern or it may have a different pattern, e.g. a pattern that is larger than and extends beyond the corresponding component island pattern.

As illustrated in FIG. 4, defining (102) the second pattern may further optionally comprise inserting (1023) a stress relief island for at least two component interconnection tracks, the stress relief island having a stress relief island pattern fully covering the corresponding at least two component interconnection patterns. Such stress relief island for at least two component interconnection tracks may fully cover a plurality of component interconnection patterns.

Optionally, in a method according to the first aspect of the present disclosure, defining (102) the second pattern may further comprise inserting (1024) at least one line-shaped or beam-shaped stress relief element between a first stress relief island and a second stress relief island. Such line-shaped or beam-shaped stress relief elements may or may not function as a stress relief interconnection track. For example, such line-shaped or beam-shaped stress relief elements may mainly have a mechanical function without being directly related to a component interconnection track or pattern. They may be provided for improving the stress distribution during the thermo-forming process and for maintaining a desired relative position between the first stress relief island and the second stress relief island. The line-shaped or beam-shaped stress relief elements form a connection between the first stress relief island and the second stress relief island. They may have straight boundary lines, non-straight boundary lines or a combination of straight and non-straight boundary lines.

In embodiments of the present disclosure the non-flat device to be formed by deformation of the flat device may comprise a surface having a non-developable shape, such as for example a spherical shape, the present disclosure not being limited thereto.

For example, in embodiments wherein the non-flat device comprises a surface having a spherical shape, at least part of the at least one line-shaped or beam-shaped stress relief elements may be oriented along a longitudinal line (radial line, meridional line) of the spherical shape. For example, in embodiments wherein the non-flat device comprises a surface having a spherical shape, at least part of the at least one line-shaped or beam-shaped stress relief elements may be oriented along a latitudinal line (e.g. circumferential line or line parallel to circumferential line) of the spherical shape.

In the further description, methods in accordance with embodiments of the present disclosure are described in more detail with a focus mainly on examples wherein a flat device having a disk shape (or part of a disk shape) or a ring shape is transformed into, i.e. deformed into, a non-flat structure having a spherical cap shape (or part of a spherical cap shape), as may be used in a fabrication method for smart contact lenses. However, the present disclosure is not limited thereto and a method in accordance with embodiments of the present disclosure may also be used for other devices and/or for fabricating non-flat devices involving deformations or transformations other than from a disk shape to a spherical cap shape.

Figure 5:
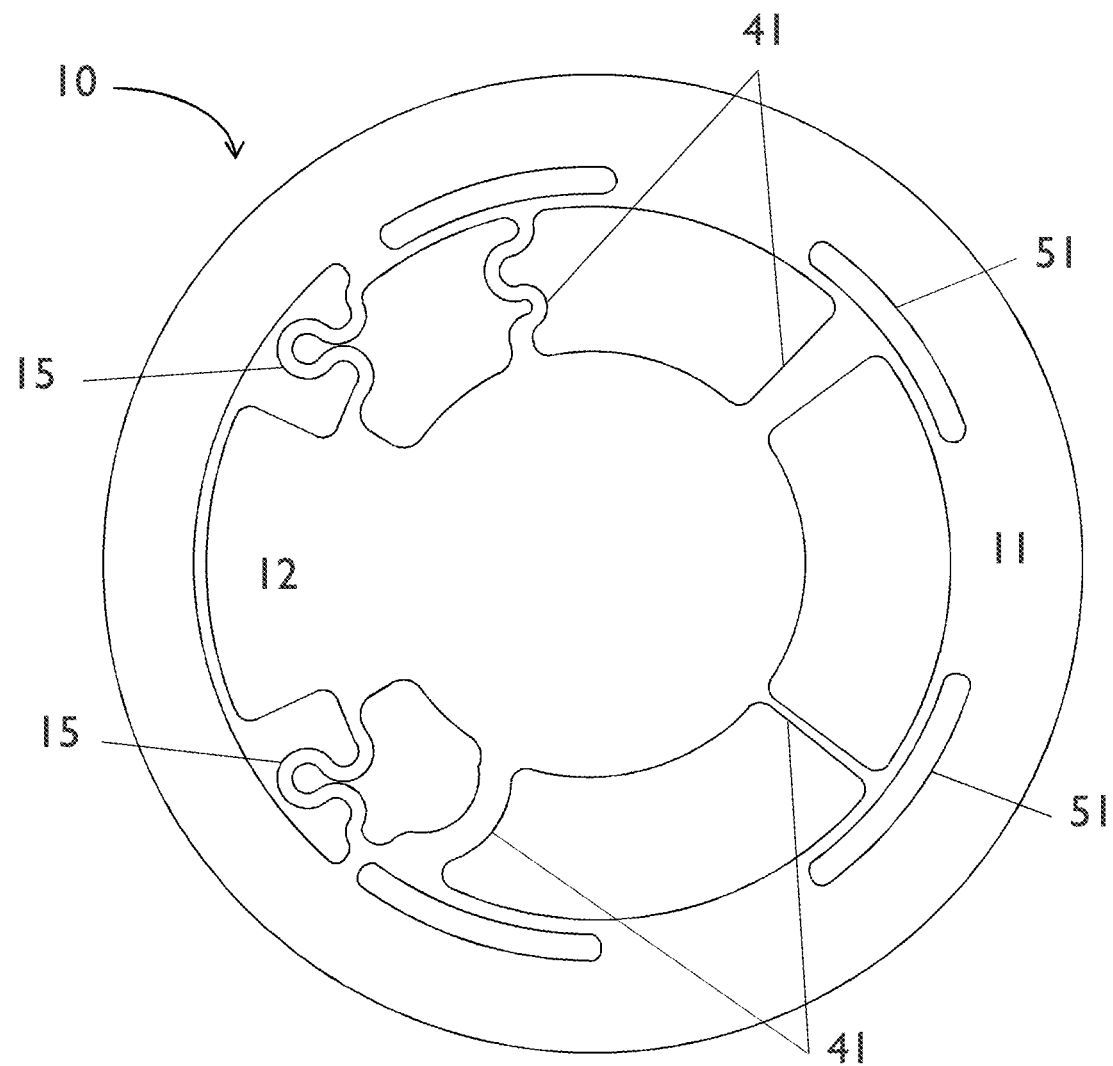
FIG. 5 illustrates an example of a layout (second pattern) of a patterned stress relief layer that may be used in an embodiment of a method according to the present disclosure.
Figure 6:
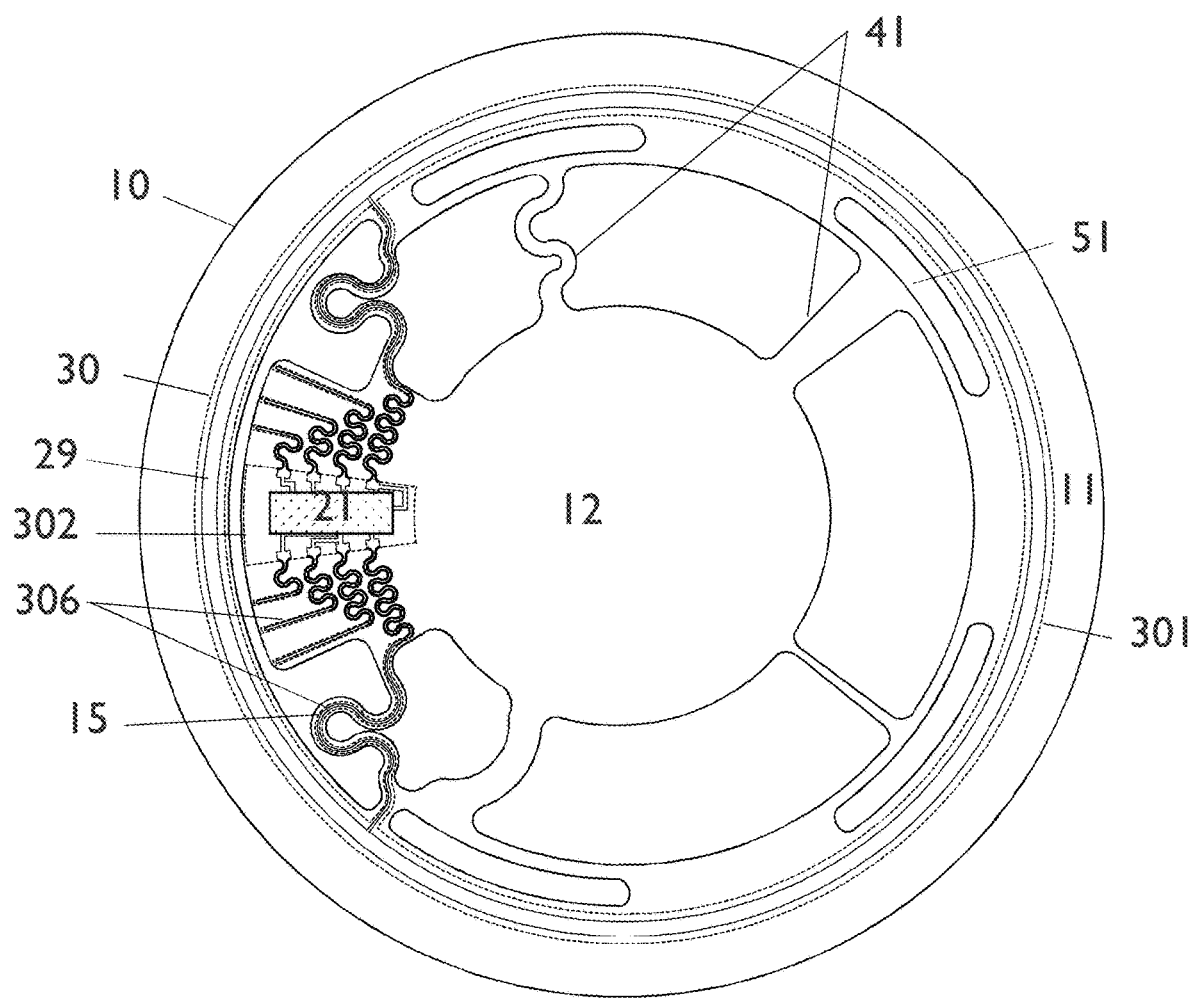
FIG. 6 schematically illustrates a combination of a flat device as shown in FIG. 2(a) with a patterned stress relief layer as shown in FIG. 5, according to an embodiment of the present disclosure.

FIG. 5 illustrates an example of a layout (second pattern) of a patterned stress relief layer 10 (layer of thermoplastic material) that may be used in an embodiment of a method according to the present disclosure. The example shown in FIG. 5 may e.g. be designed for being combined with (mechanically attached to) the flat device 20 shown in FIG. 2(a). FIG. 6 schematically illustrates the combination of a flat device 20 as shown in FIG. 2(a) with a patterned stress relief layer 10 as shown in FIG. 5.

In the example shown in FIG. 5, the stress relief layer 10 is patterned according to a second pattern. The second pattern comprises a first stress relief island 11 and a second stress relief island 12. As illustrated in FIG. 6, the first stress relief island 11 has a stress relief island pattern that is designed for (partially) covering the first component island 301 of the first pattern of the supporting layer 30 of the example shown in FIG. 2(a). In the example shown the first stress relief island pattern comprises perforations or openings 51, such that it is only partially covering the first component island pattern. In the example shown in FIG. 5 the openings 51 have a partial ring shape. However, other shapes may be used for these openings 51, such as for example circles, squares, polygons, fractal shapes, combinations of geometrical shapes (e.g. as in a honeycomb shape, comprising a combination of hexagons) or more complex and/or irregular patterns e.g. with straight or curved boundaries or a combination of straight and curved boundaries. The shape and the size of the perforations and the number of perforations may affect the stress distribution throughout the structure during the thermoforming process. Their specific design and distribution may for example be optimized based on Finite Element simulations. The different openings 51 may all have the same shape and size or they may have a different shape and/or a different size.

Based on Finite Element Modeling simulations of stresses related to thermoforming of a layer of thermoplastic material having a ring shape and of a layer of thermoplastic material having a shape with a perforated ring, it was shown that compressive stress (causing wrinkling) mainly occurs near the outer edge and that tensile stress mainly occurs near the inner edge of the layer. When comparing the ring-shaped layer to a layer that is further patterned with perforations or openings in the ring shaped layer (as for example illustrated in FIG. 5), it was concluded that lower stress levels (both for the compressive stress and for the tensile stress) are obtained in case of a perforated layer, indicating efficient stress relaxation, leading to a better distribution of stress throughout the layer.

In the example shown in FIG. 5, the second stress relief island 12 has a stress relief island pattern that is designed for fully covering the second component island 302 of the first pattern of the supporting layer 30 of the example shown in FIG. 2(a). The pattern of the second stress relief island 12 is designed for further fully covering a plurality of component interconnection tracks 306. The second pattern illustrated in FIG. 5 further comprises stress relief interconnection tracks 15 having a stress relief interconnection pattern that is designed for fully covering a corresponding component interconnection track 306 of the first pattern of the supporting layer 30 of the example shown in FIG. 2(a). In the example shown in FIG. 5 the second pattern further comprises stress relief elements 41 that are designed as line-shaped or beam-shaped elements connecting the first stress relief island 11 with the second stress relief island 12. These line-shaped or beam-shaped stress relief elements mainly have a mechanical function; they are not provided for supporting a component interconnection track. The line-shaped or beam-shaped stress relief elements may be provided for accommodating deformation during the thermoforming process and they may contribute to a reduction of stress and/or to a better redistribution of stress. Their presence may assist in obtaining a desired relative position of the different parts of the device, e.g. for obtaining a predetermined distance between stress relief islands, while allowing stretchability during the thermoforming process.

In the example shown in FIG. 5, beam-shaped elements with different shapes are shown, with straight and non-straight (curved, meandering) lateral edges. However, other shapes of these elements may be used. The example of FIG. 5 shows four beam-shaped elements 41, but the present disclosure is not limited thereto and a different number of beam-shaped elements may be provided, e.g. more than four, but at least two. In the example shown in FIG. 5 the beam-shaped elements 41 are substantially evenly spread, i.e. they are provided at substantially equal distances from each other. However, the present disclosure is not limited thereto and distances between neighboring beam-shaped elements 41 may be different for different elements. The number of beam-shaped elements, their shape and their distribution may for example be optimized based on Finite Element simulations, in view of optimizing stress distribution during the thermoforming process. Their shape at the interface with the stress relief islands may also be optimized to form a mechanically robust connection with the stress relief islands. Such optimization may be done based on Finite Element simulations.

In the example illustrated in FIG. 6 boundary lines (border lines, perimeter lines) of the second pattern are different from boundary lines of the first pattern. More in particular, all boundary lines of the second pattern extend beyond boundary lines of the first pattern. However, the present disclosure is not limited thereto and for example, at least part of the boundary lines of the second pattern may be substantially coincident with boundary lines of the first pattern and/or at least part of the boundary lines of the second pattern may be located between boundary lines of the first pattern.

In embodiments of the present disclosure, by reducing the amount of overlap between the second pattern of the stress relief layer and the first pattern of the supporting layer, the tensile forces acting during the thermoforming process towards the center of the structure may be reduced, thus reducing compressive stress in the circumferential direction and thus reducing wrinkle formation. Therefore, a relatively low amount of overlap may reduce the amount of compressive stress and thus reduce wrinkle formation. However, there is a lower limit for the amount of overlap, because the mechanically deformable flat device needs to be sufficiently covered by the layer of thermoplastic material to enable proper transformation into a shape-retaining non-flat device structure by means of the thermoforming process.

Figure 7:
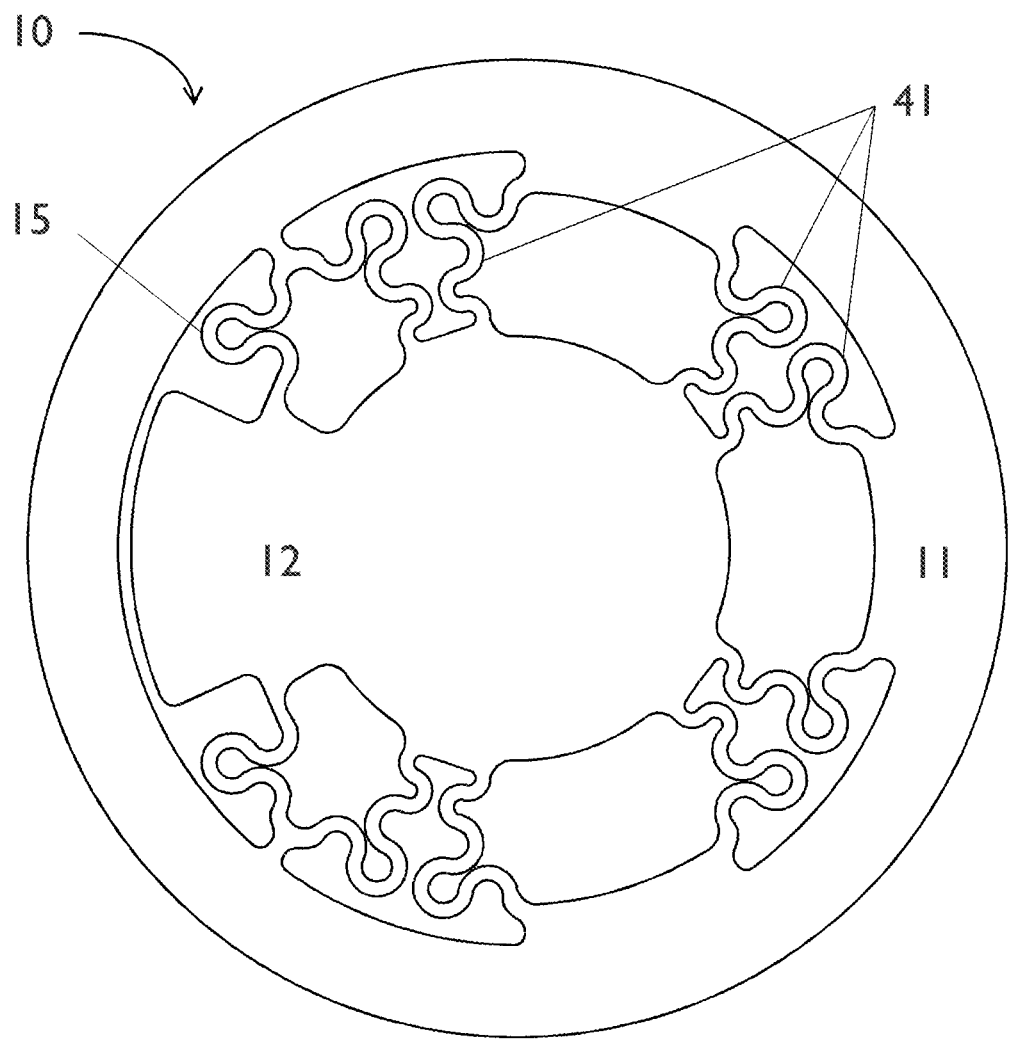
FIG. 7 and FIG. 8 illustrate an example of a layout (second pattern) of a patterned stress relief layer that may be used in an embodiment of a method according to the present disclosure.

FIG. 7 illustrates another example of a layout (second pattern) of a patterned stress relief layer 10 (layer of thermoplastic material) that may be used in an embodiment of a method according to the present disclosure. The example shown in FIG. 7 may e.g. be designed for being combined with (mechanically attached to) the flat device 20 shown in FIG. 2(a). In the example shown in FIG. 7, the stress relief layer 10 is patterned according to a second pattern, the second pattern comprising the same or similar elements as the second pattern shown in FIG. 5 (stress relief islands 11, 12; stress relief interconnection tracks 15; stress relief elements 41). In the example shown in FIG. 7 the first stress relief island 11 has no openings or perforations. It has a stress relief island pattern that is designed for fully covering the first component island 301 of the first pattern of the supporting layer 30 of the example shown in FIG. 2(a). In the example shown in FIG. 7 distances between neighboring beam-shaped elements 41 are different for different elements. In this specific example the beam-shaped stress relief elements 41 are grouped two by two and they have a meandering shape. Based on simulations it was shown that such double-meander structures, wherein the beams are provided in groups of two meandering beams as illustrated in FIG. 7 may reduce stress, for example in view of accommodating tensile strain towards the center of the platform during the thermoforming process. Such double-beam structures may also be used in the design of stress relief interconnection tracks 15. In the example shown in FIG. 7 the two beams within each pair have a mirrored shape with respect to each other. However, this is only an example and the present disclosure is not limited thereto. In other embodiments, the shape of the beams within a pair may be substantially different.

Figure 8:
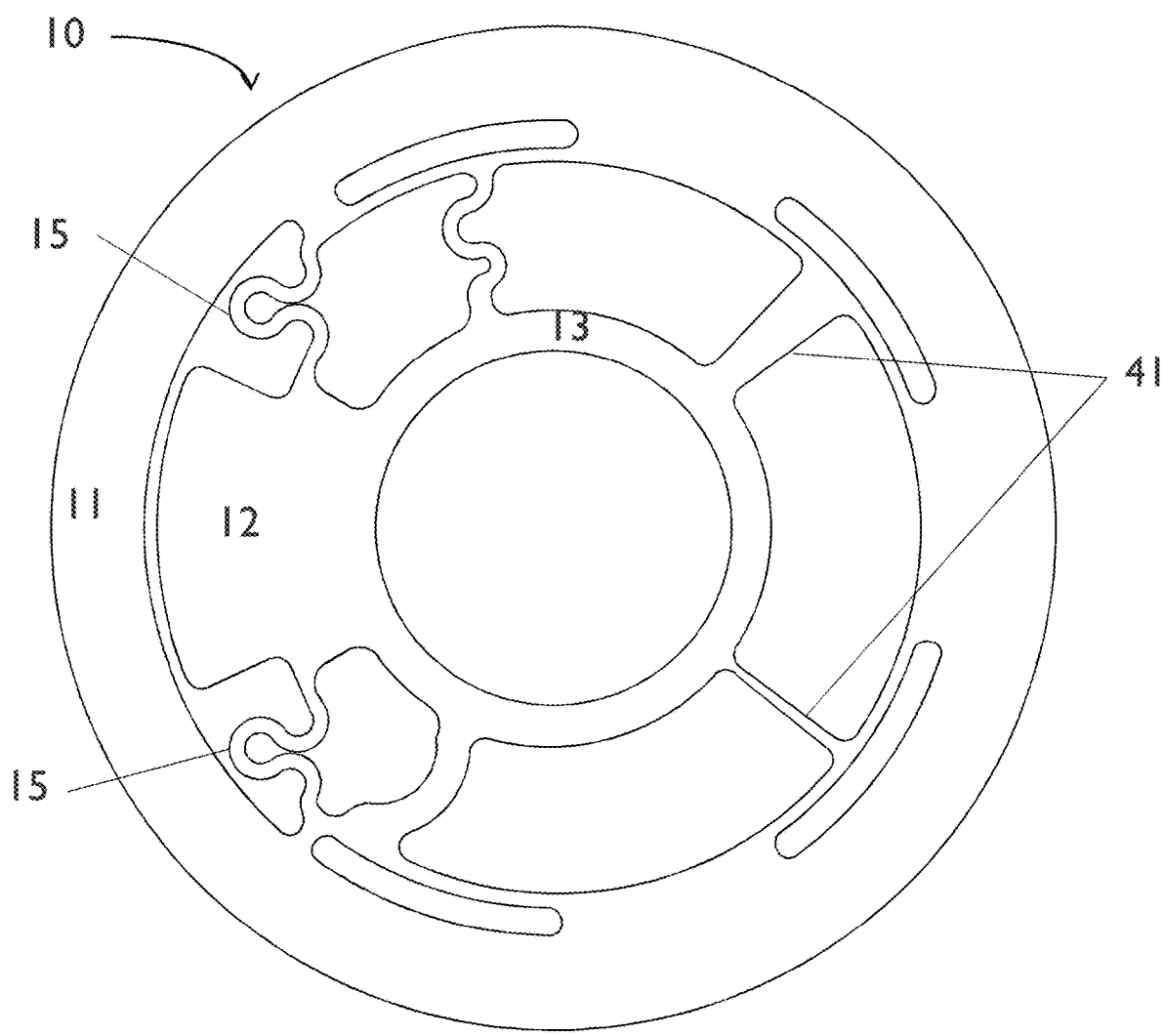
Figure 9:
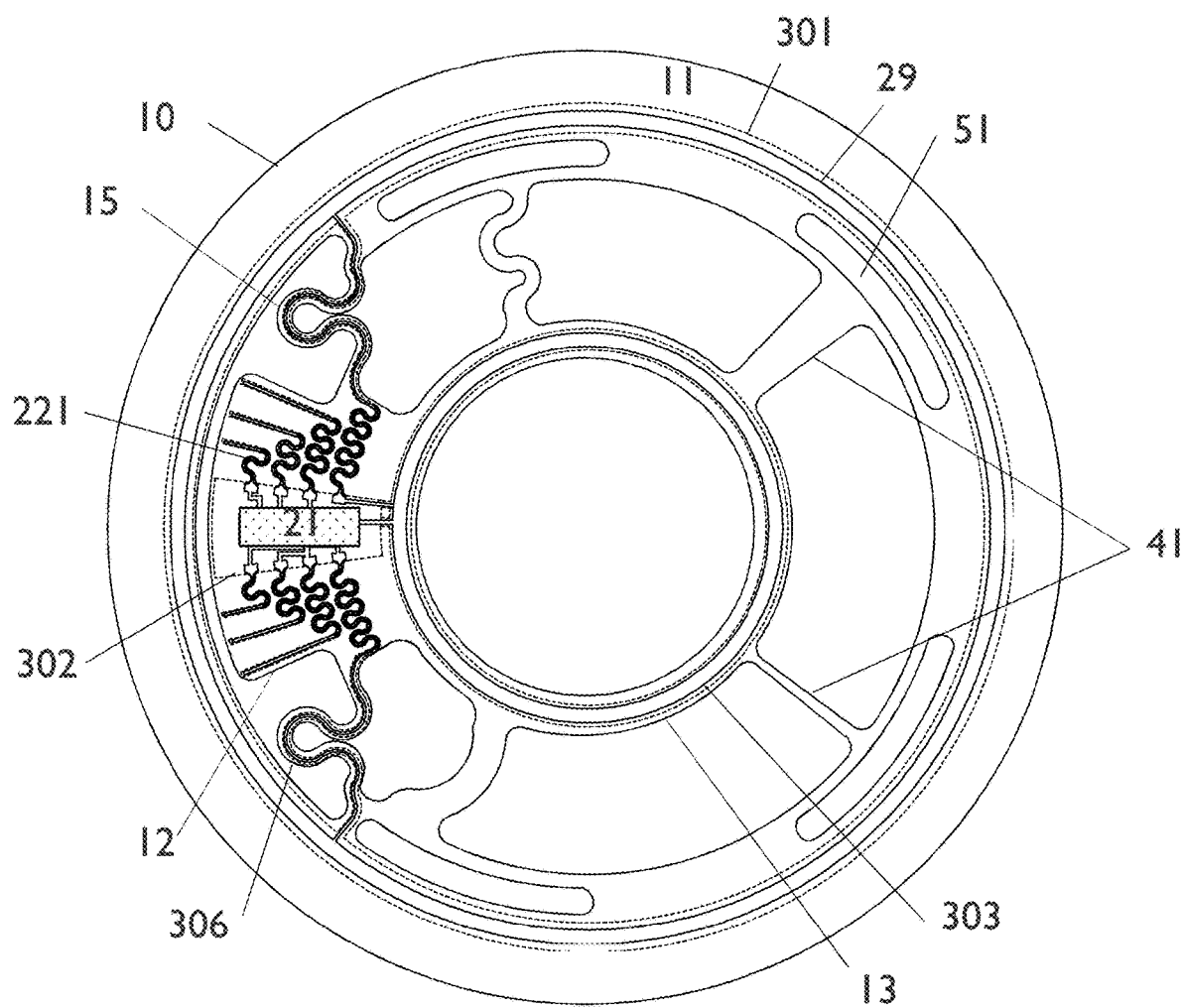
FIG. 9 schematically shows a combination of a flat device as shown in FIG. 3(a) with a patterned stress relief layer as shown in FIG. 8, according to an embodiment of the present disclosure.

FIG. 8 illustrates an example of a layout (second pattern) of a patterned stress relief layer 10 (layer of thermoplastic material) that may be used in an embodiment of a method according to the present disclosure. The example shown in FIG. 8 may e.g. be designed for being combined with (mechanically attached to) the flat device 20 shown in FIG. 2(*a*) or for being combined with the flat device 20 shown in FIG. 3(*a*). FIG. 9 schematically illustrates the combination of a flat device 20 as shown in FIG. 3(*a*) with a patterned stress relief layer 10 as shown in FIG. 8. As compared to the second pattern shown in FIG. 5, the layout of the second pattern of the stress relief layer shown in FIG. 8 comprises a third stress relief island 13. In the example shown the third stress relief island 13 has a ring shape, with a central opening 14. As illustrated in FIG. 9, the supporting layer of the flat device comprises a third component island 303. The third stress relief island 13 has a stress relief island pattern that is fully covering the corresponding component island pattern of the third stress relief island 13.

Figure 10:
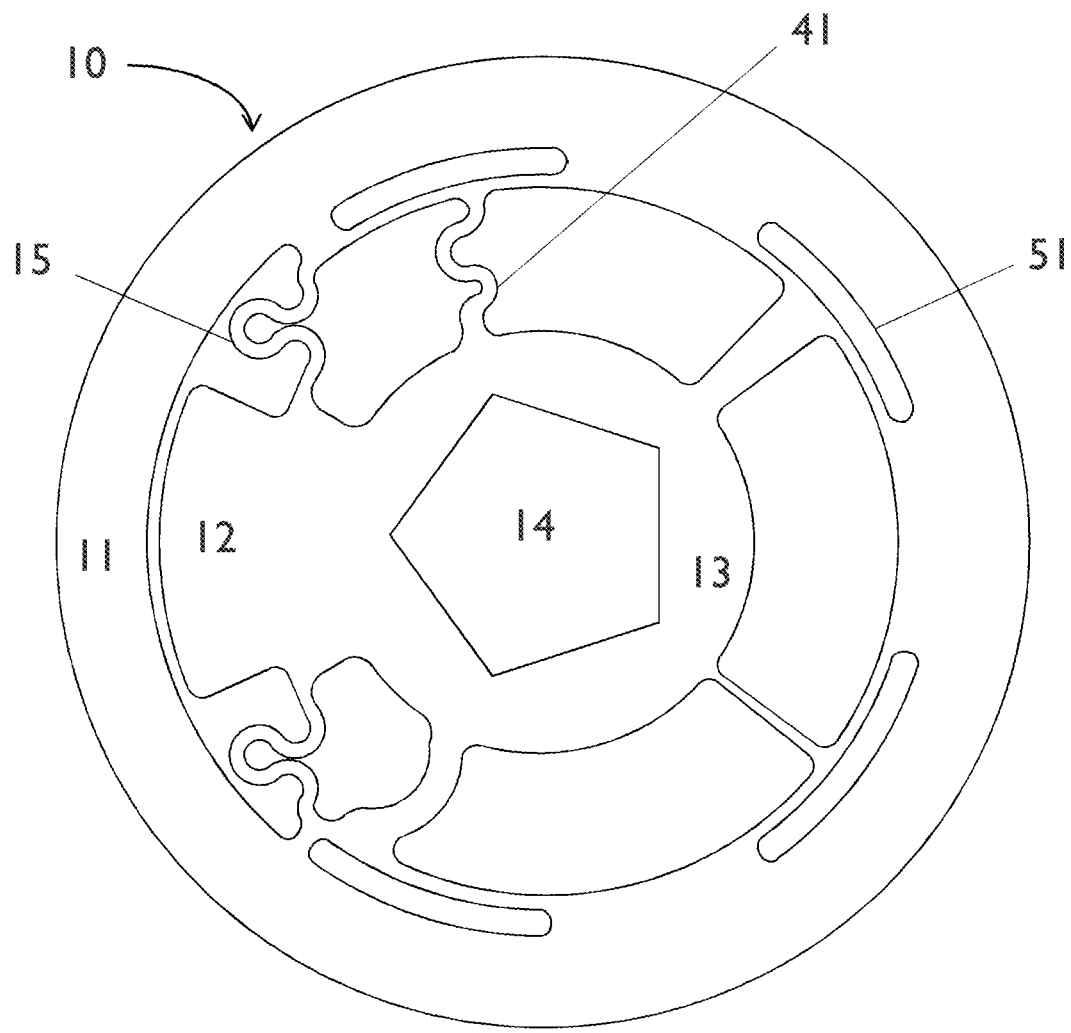
FIG. 10 illustrates an example of a layout (second pattern) of a patterned stress relief layer that may be used in an embodiment of a method according to the present disclosure.

FIG. 10 illustrates another example of a layout (second pattern) of a patterned stress relief layer 10 (layer of thermoplastic material) that may be used in an embodiment of a method according to the present disclosure. The example shown in FIG. 10 may e.g. be designed for being combined with (mechanically attached to) the flat device 20 shown in FIG. 2(*a*) or for being combined with the flat device 20 shown in FIG. 3(*a*). As compared to the second pattern shown in FIG. 8, the layout of the second pattern of the stress relief layer shown in FIG. 10 comprises a third stress relief island 13 with a different shape, more in particular a shape with a central opening 14 having a polygon (pentagon) shape. The present disclosure is however not limited thereto, and a central opening 14 may have another shape, such as for example an ellipse shape, any regular polygon shape or an irregular shape.

Figure 11:
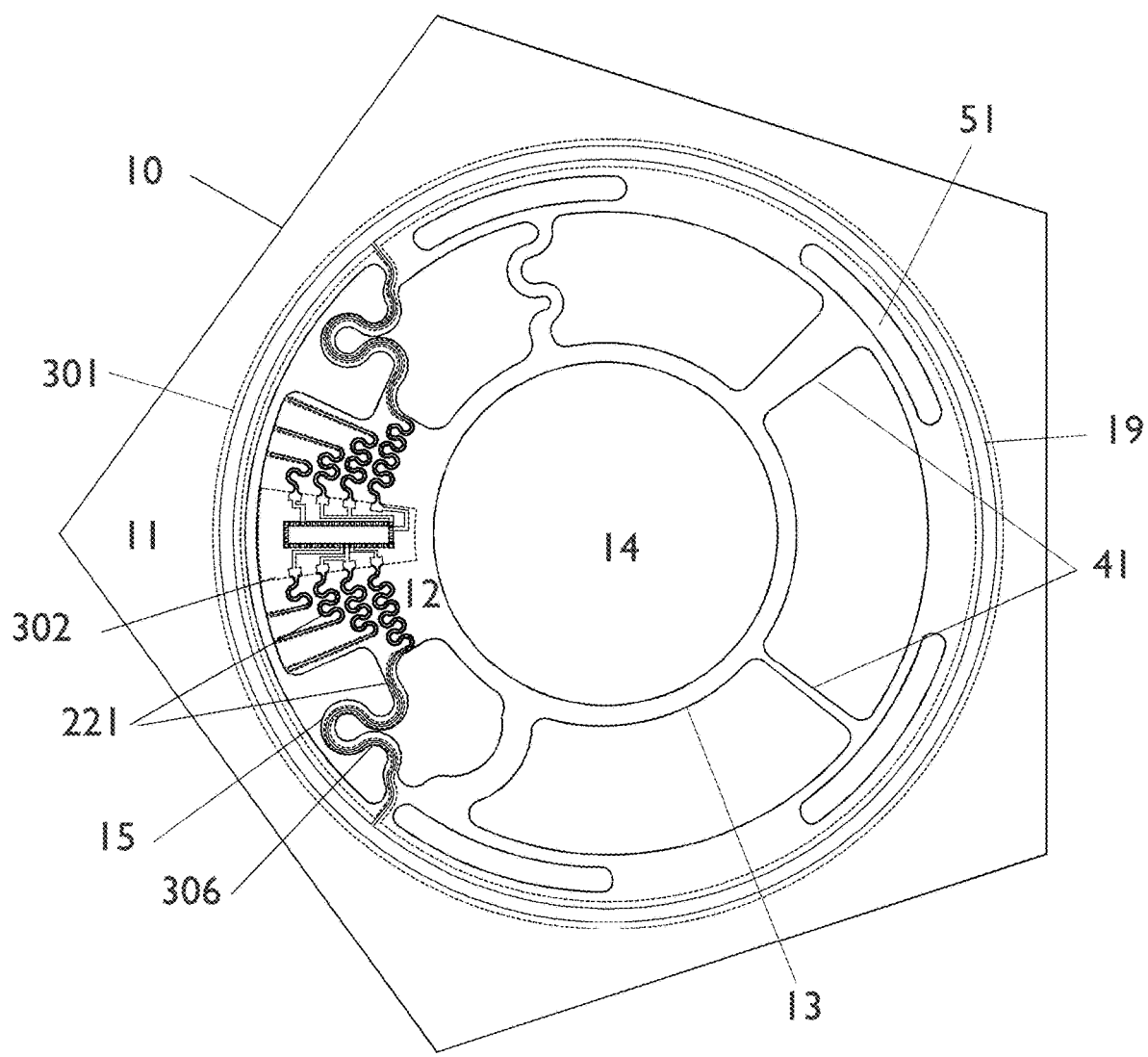
FIG. 11 schematically illustrates an example of a layout (second pattern) of a patterned stress relief layer that may be used in an embodiment of a method according to the present disclosure, combined with a flat device as shown in FIG. 2(a).

FIG. 11 schematically illustrates another example of a layout (second pattern) of a patterned stress relief layer 10 that may be used in an embodiment of a method according to the present disclosure, combined with a flat device as shown in FIG. 2(*a*). The second pattern shown in FIG. 11 may also be combined with other flat devices, such as for example the flat device shown in FIG. 3(*a*), the present disclosure not being limited thereto. As compared to the second pattern shown in FIG. 8, the layout of the second pattern of the stress relief layer shown in FIG. 11 comprises a first stress relief island 11 with a different shape, more in particular a shape with an outer border having a polygon (pentagon) shape. The present disclosure is however not limited thereto, and an outer border (or other border) may have another shape, such as for example an ellipse shape, any regular polygon shape or an irregular shape.

Figure 12:
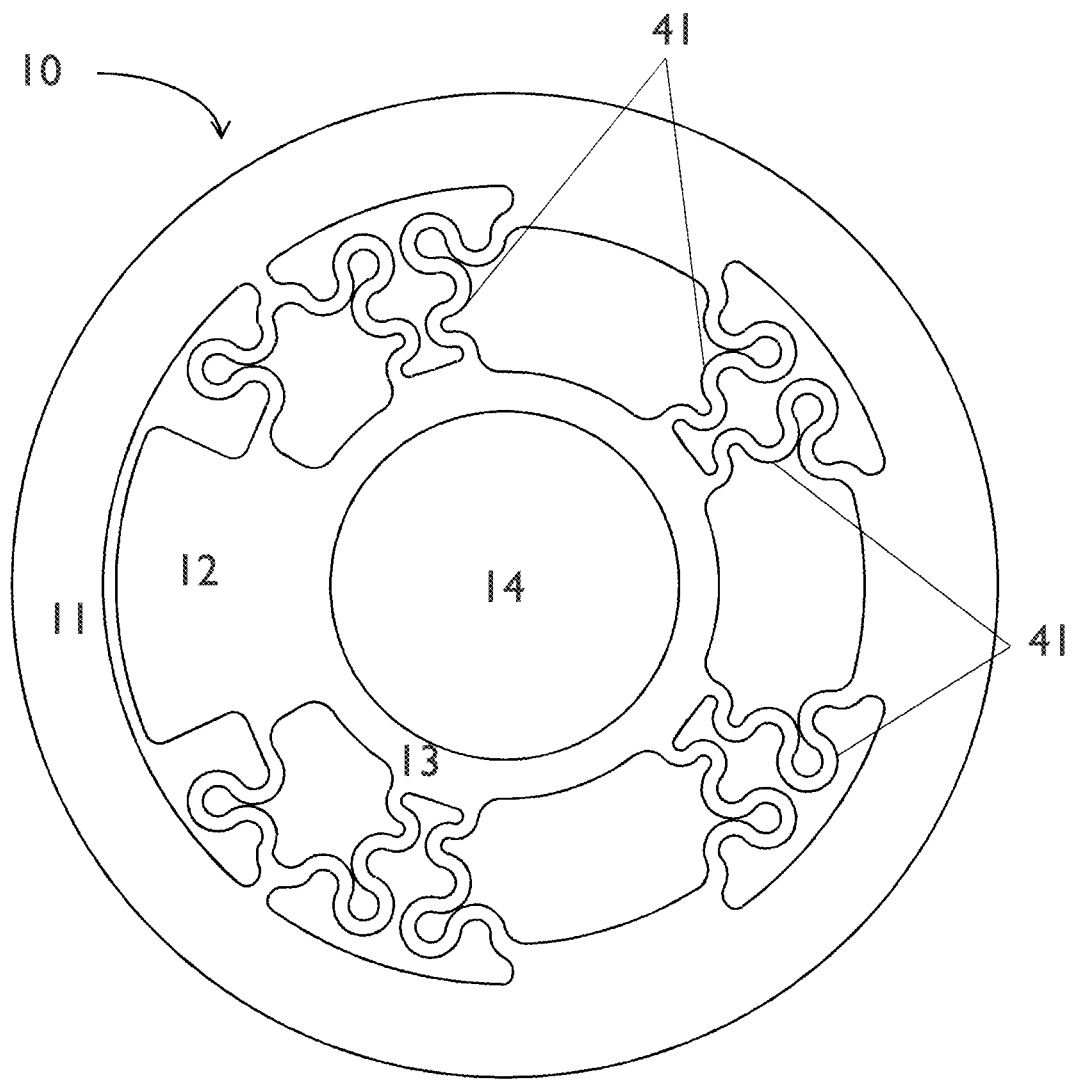
FIG. 12 illustrates an example of a layout (second pattern) of a patterned stress relief layer that may be used in an embodiment of a method according to the present disclosure.

FIG. 12 illustrates an example of a layout (second pattern) of a patterned stress relief layer that may be used in an embodiment of a method according to the present disclosure, wherein the second pattern comprises double meander structures as described above with respect to FIG. 7. The patterned stress relief layer 10 illustrated in FIG. 12 may for example be combined with a flat device as shown in FIG. 2(*a*) or with a flat device as shown in FIG. 3(*a*) or with other flat devices.

FIG. 13 schematically illustrates an example of a non-flat device 60 in accordance with embodiments of the present disclosure. The non-flat device 60 shown in FIG. 13 has a non-developable surface comprising a first surface part 61 having a spherical shape and a second surface part 62 having a spherical shape. Lines 71 and 72 indicate a central axis of first surface part 61 and second surface part 62 respectively. FIG. 13(*a*) and FIG. 13(*b*) show a perspective view of the non-flat device 60. FIG. 13(*c*) shows a top view of the device 60. The dashed circular lines in FIG. 13(*c*) schematically emphasize the spherical shape of surface parts 61, 62. FIG. 13(*d*) shows a schematic representation of some elements of a second pattern of a stress relief layer 30 that may be designed according to an embodiment of the present disclosure for being combined with a flat device before thermoforming to obtain the non-flat device 60. More in particular, FIG. 13(*d*) illustrates an example of how beam-shaped stress relief elements 411, 412 may be included in the design of the second pattern. First beam-shaped stress relief elements 411 are oriented substantially along a longitudinal line of first spherical shape 61 and second spherical shape 62. They may be provided mainly for accommodating tensile stress along the longitudinal direction. In addition, second beam-shaped elements 412 are oriented substantially along a latitudinal line of second spherical shape 62. They may be provided mainly for accommodating compressive stress along the latitudinal (circumferential) direction and thus for substantially reducing or avoiding wrinkle formation.

In a second aspect, the present disclosure is related to a method of manufacturing a shape-retaining non-flat device by deformation of a flat device, wherein the flat device is attached (before deformation) to a patterned stress relief layer designed in accordance with the first aspect of the present disclosure. In some embodiments the stress relief layer is a thermoplastic layer and deformation of the flat device comprises deformation by a thermoforming process.

A method of manufacturing a shape-retaining non-flat device by deformation of a flat device, wherein the non-flat device comprises at least two components and at least one electrical interconnection between two components, comprises: taking into account the layout of the flat device, obtaining a second pattern of a stress relief layer in accordance with an embodiment of a method of the first aspect of the present disclosure; obtaining the flat device; providing a stress relief layer comprising a layer of thermoplastic material; mechanically attaching the flat device to the stress relief layer; and patterning the stress relief layer according to the second pattern. A method of manufacturing according to the second aspect of the present disclosure further comprises deforming the stress relief layer with the flat device attached thereto into the non-flat device by a thermoforming process using a mold having a shape corresponding to the shape of the non-flat device.

Figure 14:
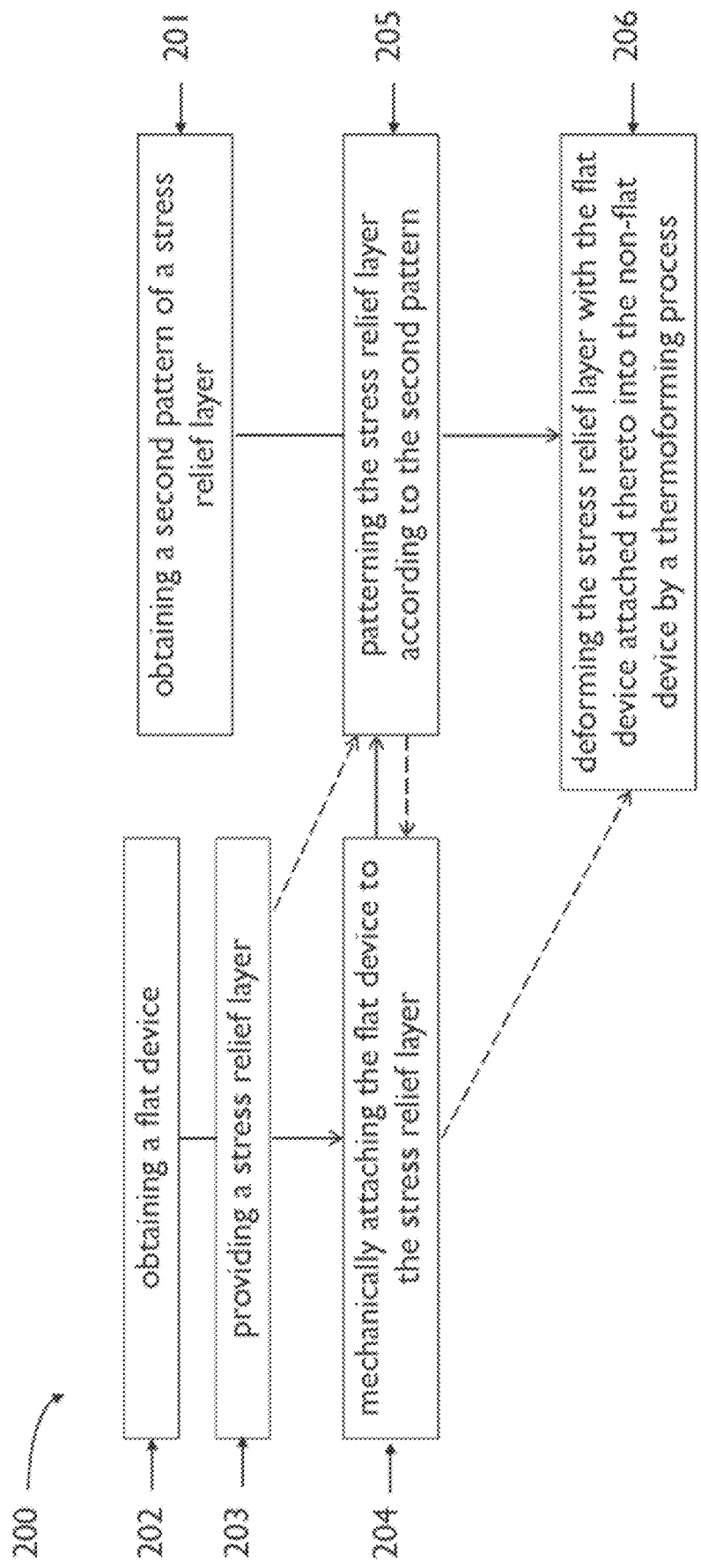
FIG. 14 schematically shows an example of a process flow of a method for manufacturing a shape-retaining non-flat device in accordance with an embodiment of a method of the second aspect of the present disclosure.

An example of a process flow of a method 200 for manufacturing a shape-retaining non-flat device in accordance with an embodiment of a method of the second aspect of the present disclosure is schematically shown in FIG. 14.

The method 200 illustrated in FIG. 14 comprises, after selection of a flat device and taking into account the layout of the flat device, obtaining (FIG. 14, step 201) a second pattern of a stress relief layer, wherein the second pattern of the stress relief layer is designed in accordance with an embodiment of a method of the first aspect of the present disclosure. After obtaining the flat device (FIG. 14, step 202) and after obtaining or providing a stress relief layer (FIG. 14, step 203) the flat device is mechanically attached to the stress relief layer (FIG. 14, step 204).

In embodiments of the present disclosure, the stress relief layer (layer of thermoplastic material) is provided as a flat layer (e.g. a substrate) comprising at least one thermoplastic material such as e.g. thermoplastic polyurethane, polyethylene terephthalate (PET), polyethylene naphthalate (PEN), poly lactic acid (PLA), parylene-C, polycarbonate (PC), poly copolymers (PLGA), or permanent photoresists, the present disclosure not being limited thereto. It may comprise a single thermoplastic layer or it may comprise a stack of at least two thermoplastic layers. Thermoplastic materials with a relatively low glass transition temperature are used, such as for example materials having a glass temperature lower than 150° C., the present disclosure not being limited thereto.

In embodiments of a method according to the present disclosure, the flat device 20 may be attached to a single stress relief layer 10. In other embodiments of a method according to the present disclosure, the flat device 20 may be attached to more than one stress relief layer 10. For example, the flat device may be embedded between a first stress relief layer and a second stress relief layer. In such embodiments, the second pattern of the first stress relief layer and the second pattern of the second stress relief layer may be substantially the same. However, the present disclosure is not limited thereto, and in embodiments the second pattern of the first stress relief layer and the second pattern of the second stress relief layer may be different.

In embodiments of the present disclosure the step of mechanically attaching the flat device 20 to the stress relief layer 10 (step 204) may for example comprise laminating the flat device with the stress relief layer. For example, the flat device may be laminated between a first stress relief layer and a second stress relief layer, such that a stack of a stress relief layer/flat device/stress relief layer is formed.

Step 205 of the method 200 shown in FIG. 14 comprises patterning the stress relief layer according to the second pattern, the second pattern being designed in accordance with an embodiment of the first aspect of the present disclosure. In some embodiments the mechanical attachment step (step 204), e.g. lamination step, is done before the step of patterning the stress relief layer (step 205). This process sequence is indicated in FIG. 14 by means of non-dashed arrowed lines. Patterning of the stress relief layer or stress relief layers after attaching the flat device allows the need for accurate alignment between the device and the second pattern to be avoided. For example, in such embodiments a first, non-patterned, stress relief layer may be laminated with the flat device at a first side (typically the component side) of the device. The flat device may be attached to a temporary rigid carrier such as a glass carrier at a second side opposite to the first side, or it may be free standing. Next the temporary rigid carrier, if present, is removed and a second, non-patterned stress relief layer is laminated to the structure, at the second side of the circuit. The stress relief layer(s) may then be patterned, e.g. using laser ablation.

In other embodiments the mechanical attachment step (step 204), e.g. lamination step, may be done after the step (step 205) of patterning the stress relief layer(s). This process sequence is indicated in FIG. 14 by means of dashed arrowed lines. This approach requires proper, accurate alignment between the flat device 20 (more in particular the first pattern of the supporting layer 30) and the second pattern of the patterned stress relief layer(s) 10.

In a method according to the second aspect of the present disclosure, after the steps of mechanically attaching the flat device to the stress relief layer (FIG. 14, step 204) and patterning the stress relief layer (FIG. 14, step 205), the platform comprising the stress relief layer with the flat device attached thereto is deformed into the non-flat device (FIG. 14, step 206) by means of a thermoforming process.

During the thermoforming process, different boundary conditions may be used at the outer edges (perimeter) of the platform: a free-standing boundary condition, a fixed boundary condition or a semi-fixed boundary condition. In case of a free-standing boundary condition the platform is placed on a mold without any attachment at the edges, and without any moving restriction. A free boundary condition may lead to relatively large compressive stress along the circumferential direction, which may lead to wrinkle formation. The stress level may be reduced by patterning the layers of the platform in accordance with a method of the present disclosure. In case of a fixed condition, the platform is attached to a supporting carrier made of the same material as the thermoplastic layer of the platform but having a larger size than the platform, such that it extends beyond the platform at its entire outer boundary. This supporting carrier (with the platform attached to it, e.g. laminated to the supporting carrier) is clamped on the mold in the thermoforming tool, with total moving restriction at the outer edges of the carrier. For example, mechanical clamping or pneumatic clamping can be used. Alternatively, the platform itself may be designed such that it can be clamped on the mold in the thermoforming tool such that there is no need for attachment to a supporting carrier. In this way the stress relief layer can extend to the clamping area and provide fixed reference points for the device. Such a fixed boundary condition may result in relatively large tensile stresses along the radial direction, which may lead to tensile deformation and breakage. Stress levels may be reduced by using meander shapes in the radial direction of the thermoplastic layer of the platform. In case of a semi-fixed boundary condition the supporting carrier with the platform is placed on the mold, with partial moving restriction at the outer edges. The semi-fixed boundary condition can be implemented by perforating the supporting carrier in a peripheral region, outside the region where the platform is provided. In embodiments wherein a fixed or semi-fixed boundary condition is used the platform may be cut from the supporting carrier after the thermoforming process, for example by means of laser ablation.

The thermoforming step is done at a temperature higher than the glass transition temperature of the stress relief layer (thermoplastic layer) 10. Thermoforming can be done for example using a vacuum tool or using a pressure forming tool. After the step of thermoforming, the deformable platform is removed from the mold. If a free-standing boundary condition was used during thermoforming the platform is ready to be further used. For example, in the context of smart contact lenses, it may be inserted or placed within a suitable material to contact the eye (e.g. a hydrogel). If a fixed or semi-fixed boundary condition was used during thermoforming, the platform is removed from the carrier (e.g. by laser ablation) before it is further used.

The foregoing description details certain embodiments of the disclosure. It will be appreciated, however, that no matter how detailed the foregoing appears in text, the disclosure may be practiced in many ways. It should be noted that the use of particular terminology when describing certain features or aspects of the disclosure should not be taken to imply that the terminology is being re-defined herein to be restricted to including any specific characteristics of the features or aspects of the disclosure with which that terminology is associated.

It is to be understood that although some embodiments, specific constructions and configurations, as well as materials, have been discussed herein for devices according to the present disclosure, various changes or modifications in form and detail may be made without departing from the scope of this disclosure. For example, steps may be added or deleted to methods described within the scope of the present disclosure.

Whereas the above detailed description as well as the summary of the disclosure has been focused on a method for fabricating a device, the present disclosure also relates to a device comprising patterned layers obtained using a method according to any of the embodiments as described above.

The invention claimed is:

1. A method for designing a pattern of a stress relief layer, wherein the stress relief layer comprises a layer of thermoformable material and is designed for mechanical attachment to a flat device to be transformed by thermoforming into a shape-retaining non-flat device by deformation of the flat device after mechanical attachment of the stress relief layer, the flat device comprising at least two components and at least one electrical interconnection between the at least two components, the method comprising:
   providing a layout of the flat device,
      the layout comprising the at least two components and the at least one electrical interconnection,
      the layout further comprising a patterned supporting layer having a first pattern comprising at least one first component island, at least one second component island, and at least one component interconnection track, the at least one first component island having a first component island pattern covering at least an area corresponding to the location of a first one of the at least two components, the at least one second component island having a second component island pattern covering at least an area corresponding to the location of another one of the at least two components, and the at least one component interconnection track having a component interconnection pattern covering at least an area corresponding to the location of the at least one electrical interconnection and providing a connection between the first component island and the second component island; and
   thereafter defining a second pattern at least partially covering the first pattern, wherein defining the second pattern comprises:
      defining an initial second pattern, wherein defining the initial second pattern comprises inserting a stress relief island for each component island, the stress relief island having a stress relief island pattern at least partially covering the corresponding component island pattern, and inserting a stress relief interconnection track for at least one component interconnection track, the stress relief interconnection track having a stress relief interconnection pattern fully covering the corresponding component interconnection pattern,
      adapting the initial second pattern based on Finite Element simulations in view of optimizing stress distribution during thermoforming, thereby obtaining an optimized second pattern, the optimized second pattern being the pattern of the stress relief layer.

2. The method for designing a pattern of a stress relief layer according to claim 1, wherein defining the second pattern further comprises:
   inserting an additional stress relief island for at least two component interconnection tracks, the stress relief island having a stress relief island pattern fully covering the corresponding at least two component interconnection patterns.

3. The method for designing a pattern of a stress relief layer according to claim 1, wherein defining the second pattern further comprises:
   inserting at least one beam-shaped stress relief element between the first stress relief island and the second stress relief island, wherein the at least one beam-shaped stress relief element forms a connection between the first stress relief island and the second stress relief island.

4. The method for designing a pattern of a stress relief layer according to claim 1, wherein the non-flat device comprises a surface having a non-developable shape.

5. The method for designing a pattern of a stress relief layer according to claim 3, wherein the non-flat device comprises a surface having a spherical shape.

6. The method for designing a pattern of a stress relief layer according to claim 5, wherein at least part of the at least one beam-shaped stress relief elements is oriented along a longitudinal line of the spherical shape.

7. The method for designing a pattern of a stress relief layer according to claim 5, wherein at least part of the at least one beam-shaped stress relief elements is oriented along a latitudinal line of the spherical shape.

8. The method for designing a pattern of a stress relief layer according to claim 3, wherein the beam-shaped stress relief elements have straight boundary lines, non-straight boundary lines or a combination of straight and non-straight boundary lines.

9. A method of manufacturing a shape-retaining non-flat device by deformation of a flat device, the non-flat device comprising at least two components and at least one electrical interconnection between two components, the method comprising:
   obtaining a second pattern of a stress relief layer according to claim 1;
   obtaining the flat device;
   providing a stress relief layer comprising a layer of thermoplastic material; mechanically attaching the flat device to the stress relief layer; and
   patterning the stress relief layer according to the second pattern.

10. The method of manufacturing a shape-retaining non-flat device by deformation of a flat device according to claim 9, further comprising:
    deforming the stress relief layer with the flat device attached thereto into the non-flat device by a thermoforming process using a mold having a shape corresponding to the shape of the non-flat device.

11. The method of manufacturing a shape-retaining non-flat device by deformation of a flat device according to claim 9, wherein mechanically attaching the flat device to the stress relief layer is done before patterning the stress relief layer.

12. The method of manufacturing a shape-retaining non-flat device by deformation of a flat device according to claim 9, wherein mechanically attaching the flat device to the stress relief layer comprises embedding the flat device between a first stress relief layer and a second stress relief layer.

13. The method of manufacturing a shape-retaining non-flat device by deformation of a flat device according to claim 9, wherein patterning the stress relief layer according to the second pattern comprises patterning by laser ablation.

* * * * *